United States Patent [19]
Fujita

[11] Patent Number: 5,883,855
[45] Date of Patent: Mar. 16, 1999

[54] HIGH SPEED SEMICONDUCTOR MEMORY WITH BURST MODE

[75] Inventor: Mamoru Fujita, Tokyo, Japan

[73] Assignee: NEC Corporation, Japan

[21] Appl. No.: 108,916

[22] Filed: Jul. 1, 1998

Related U.S. Application Data

[62] Division of Ser. No. 708,759, Sep. 9, 1996.

[30] Foreign Application Priority Data

Sep. 20, 1995 [JP] Japan .................................. 7-266363

[51] Int. Cl.$^6$ ...................................................... G11C 8/00
[52] U.S. Cl. ...................... 365/238.5; 365/221; 365/233
[58] Field of Search ................................ 365/238.5, 221, 365/233, 210, 235

[56] References Cited

U.S. PATENT DOCUMENTS

| | | | |
|---|---|---|---|
| 5,714,553 | 3/1998 | Shigeeda | 365/230.06 |
| 5,793,688 | 8/1998 | McLaury | 365/233 |
| 5,793,700 | 8/1998 | Oh | 365/235 |

Primary Examiner—Son T. Dinh
Attorney, Agent, or Firm—Hayes, Soloway, Hennessey, Grossman & Hage P.C.

[57] ABSTRACT

A semiconductor memory device has an input circuit for inputting reference clocks, an input buffer circuit for latching external input signals in synchronization with the reference clocks, and an output buffer circuit for outputting a stored data to an outside in synchronization with the reference clocks. The input buffer circuit and the output buffer circuit are caused to operate at respectively different edges of the reference clocks for processing one and the same stored data. The device may include an internal read-out circuit system which reads-out the stored data in accordance with the external input signal and which is caused to operate solely based on an edge at which the input buffer circuit operates. Between the internal read-out system and the output buffer circuit, there is provided a buffer circuit which temporarily stores the stored data read-out by the internal read-out circuit system until the stored data is outputted by the output buffer. The arrangement enables the provision of a high burst mode memory device in which almost no additional gate delay and no increase in its area.

8 Claims, 19 Drawing Sheets

HIGH SPEED SEMICONDUCTOR MEMORY WITH BURST MODE

This is a divisional of copending application Ser. No. 08/708,759 filed Sep. 9, 1996.

BACKGROUND OF THE INVENTION (1) Field of the Invention

The present invention relates to a semiconductor memory device, and more particularly to a reading system used in a high speed semiconductor memory device having a burst mode.

(2) Description of the Related Art

In recent years, speed differences between DRAMs (Dynamic Random Access Memories) used in memories and CPUs have been presenting problems. DRAMs whose performances have not been sufficiently improved cannot meet the requirements of CPUs in which speeds have been dramatically improved (that is, such DRAMs are unable to overcome the speed differences). For this reason, in computer systems using high speed CPUs, although its memory capacity is small as compared with the memory capacity of the main memory, a high speed cache memory is connected either internally or externally of the CPU chip for absorbing the speed difference mentioned above.

The cache memory holds a copy of a part of the data of the data stored in the main memory. The copy of the partial data is in a unit of a plurality of data having consecutive addresses, where the unit is called a "page".

Normally the CPU makes access to a cache memory. In the absence of the desired data in the cache memory, the CPU copies new data from the main memory to the cache memory. In this case, the copy is made on a unit of a page.

Thus, it is required that, for the cache memory, the memory element constituting the main memory of the system has a function of making a high speed input/output of lines of data having consecutive addresses.

In the above case, a method is employed wherein, in the memory, the designation of only a leading address enables the inputting/outputting of the data stream containing such an address in synchronization with the reference clock signal inputted from the outside. This method is called a "burst transfer" method, and the length of the data that can be inputted/outputted by the designation of one address is called a "burst length". A typical example of the memory with which the burst transfer is performed is a synchronous DRAM.

Normally, with the general purpose DRAM (a DRAM having a first page mode), the time interval from the designation of an address to the time when the data is outputted to the outside, that is, the address access time, is on the order of 20 ns (=50 MHz) as being a high speed time.

In the synchronous DRAM, the time required for the processing of one data is basically the same as that for the general purpose DRAM. However, this is speeded up to above 100 MHz by multiplexing the internal processes and internally processing a plurality of data simultaneously whereby the apparent data processing time of one data is shortened. The frequency of the data input/output under such a state, that is, the frequency of the reference clock, is called a "burst transfer frequency".

However, in both the synchronous DRAM and the general purpose DRAM, the address access times are basically the same, that is, for a single data, the internal processing time is basically the same as that for the general purpose DRAM, which means that the time required from the inputting of the command of a request for read-out to the outputting of the data is normally a plurality of reference clock cycles.

The number of reference clocks from the time when the command input of the request for read-out is made to the time when the output data is outputted to the outside is called a "/CAS (CAS (Column Address Strobe) bar) latency" (throughout the specification, the symbol "/" indicates an inversion, and "/CAS" indicates an inverse of CAS and the CAS is at a low active level).

The synchronous DRAM is normally provided with a memory circuit for setting performance conditions which is called a "mode register" and which enables the setting of a condition such as /CAS latency by a predetermined mode register setting command inputted from the outside.

The reason that the /CAS latency is so arranged as to be set from the outside is that, in the case where the burst transfer frequency of the synchronous DRAM, that is, the frequency of the reference clocks, is used after its frequency is lowered because, with the use of the reference clocks of the highest burst transfer frequency of the synchronous DRAM, other circuits or substrate wiring do not operate, it is possible to shorten the time up to the outputting of the first data by lowering the /CAS latency within the extent that the relation between the reference clock period and the /CAS latency satisfies the address access time (In the case where the reference clock frequency is low, there is no necessity of increasing the /CAS latency. Conversely, for increasing the highest burst transfer frequency when the address access time is under the predetermined conditions, it is necessary to increase the /CAS latency).

Examples of prior art multiplex internal processing technologies include a pipeline method and a prefetch method.

FIG. 1 is a timing chart for use in explaining a read operation in a typical conventional pipe line method. FIG. 1 shows timing waveforms in an example wherein the read operation is performed twice with the number of pipe line stages being four, the /CAS latency being four, and the burst length being four.

In the pipeline method, a series of the internal processes is divided into a plurality of stages, and the information relating to one data is processed at each of the stages sequentially in accordance with the reference clocks.

The conventional example shown in FIG. 1 relates to a four stage pipeline method, consisting of a first stage in which an internal column address YADD is generated, a second stage in which a pre-decode column address signal generated is generated by pre-decoding the internal column address YADD, a third stage in which an address data designated by the signal PYADD is read out to a data input/output bus IOBUS, and a fourth stage in which a data on the data input/output bus IOBUS is outputted to outside the chip from a DQ pin, thus the number of the stages totaling to four.

That is, in the clock cycles T1–T2 of the reference clock ICLK (internal clocks generated from external clock signals CLK), the address Aa0 (refer to the inputted address signal ADD) of the first data processed at the first stage for the generation of the internal column address YADD signals, is processed at the second stage during the next cycle T2–T3 of the reference clock ICLK. Simultaneously therewith, the address Aa1 of the second data is processed at the second stage. In each of the stages, the processes are simultaneously carried out so that data corresponding to the number of stages are subjected to the parallel processes.

Since all stages are being controlled by respective reference clocks ICLK, there is no possibility for information relating to a plurality of data to be present simultaneously in one stage so that, as a result, each data is outputted in synchronization with the reference clock ICLK without involving any internal collisions.

FIG. 2 is a timing chart for use in explaining a read operation in a conventional prefetch method. FIG. 2 shows timing waveforms in an example wherein the read operation is performed twice with the number of parallel processes (prefetch number) being two, the /CAS latency being three, and the burst length being four.

In the prefetch method, the internal processes are carried out in parallel, the data are prefetched by inputs/outs, and a parallel-to-serial data conversion is performed. That is, a plurality of paths for the internal processing of the data are provided, and the same process is carried out essentially at the same time for a plurality of data. However, since the data cannot be outputted simultaneously, a plurality of data simultaneously processed are first subjected to a parallel-to-serial conversion, and the resulting serial data are sequentially outputted in accordance with the reference clocks.

That is, for outputting the data after the conversion, the same number of the reference clocks as the number of the parallel processes before the conversion is required. Thus, where the processing before the parallel-to-serial conversion is carried out with the same number of the reference clocks as the number of parallel processes, it is possible to output the data uninterruptedly.

As seen in FIG. 2, with the reference clocks as being two cycles of T1–T3, the reading of the data out to the data input/out bus IOBUS is performed from the take-in of the external address ADD. At this time, the data read-out is of two bits of Da0 and Da1, out of which the data Da0 is outputted to the outside during a cycle of T3–T4 of the reference clocks, and the data Da1 is outputted during a cycle of T4–T5.

As explained above, the pipeline method and the prefetch method are methods for increasing the maximum performance frequency of a burst transfer frequency in a memory having a burst performance function such as a synchronous DRAM.

In the pipeline method, in order to enhance the maximum burst transfer frequency, the number of stages of the pipeline is increased, and the processing time in each stage is reduced thus allowing to increase the degree of parallel processes. However, because of the relationship with the internal processing in the DRAM, the places at which a given stage may be separated are limited. Also, it is necessary for the minimum reference clock cycle to be timed to the stage which requires the maximum time. Further, since the overhead of the circuit interconnecting the stages increases, the number of stages in practice is limited to three to four.

Also, for enhancing the maximum burst transfer frequency in the prefetch method, the number of data to be processed in parallel is increased. For this reason, the same number of identical circuits as the number of parallel processes are required, and this means that the circuit scale becomes large and, for realizing this, the chip area also becomes large.

In the prefetch method, the data must be outputted by the parallel processes as units so that any data less than one parallel process cannot be outputted.

For the above reasons, an increase in the degree of the parallel processes leads to the lowering of the functional freedom, and a computer system utilizing this suffers from the lowering of performance characteristics. Thus, the number of the parallel processes, that is, the multiplicity of the parallel processes, is limited to about two.

In the two methods explained above, the data processing can be speeded up by increasing the multiplicity of the data. However, there are limits to the degree of the multiplicity in each of the two methods. That is, the limits are in the maximum burst transfer frequency.

SUMMARY OF THE INVENTION

An object of the present invention, therefore, is to overcome the problems existing in the prior art, and to provide a semiconductor memory device which realizes a high speed read performance in a burst mode.

According to one aspect of the invention, there is provided a semiconductor memory device comprising:

an input circuit for inputting reference clocks;

an input buffer circuit for latching external input signals in synchronization with the reference clocks; and an output buffer circuit for outputting a stored data to an outside in synchronization with the reference clocks, the input buffer circuit and the output buffer circuit being such that they are caused to operate at respectively different edges of the reference clocks for processing one and the same stored data.

The semiconductor memory device preferably includes an internal read-out circuit system which reads-out the stored data in accordance with the external input signal and which, with the exception of the output buffer circuit is caused to operate solely based on an edge at which the input buffer circuit operates.

Also, the semiconductor memory device preferably includes a buffer circuit which temporarily stores the stored data read-out by the internal read-out circuit system until the stored data is outputted by the output buffer, the buffer circuit being disposed between the internal read-out circuit system and the output buffer circuit.

Further, the buffer circuit may be constituted by a plurality of memory circuits connected in parallel for controlling inputs of data by input control signals and for controlling outputs of data by output control signals.

According to another aspect of the invention, there is provided a semiconductor memory device having a burst transfer function, comprising:

a circuit system which generates an internal column address from an address signal based on a reference clock signal and reads-out to an input/output bus a data through a sense amplifier and a read-out amplifier from a memory cell in which a pre-decoded column address connected to a selection line of a memory cell array through a decoder, the circuit system being configured at least by one of a pipeline system and a prefetch system, the pipeline system being one in which a plurality of process operations are carried out in one and the same cycle and the prefetch system being one in which a plurality of signal paths are provided in parallel; and a first-in first-out buffer circuit may be provided between the input/output bus and an output buffer circuit, and be configured such that the data from the memory cell is processed in asynchronization with the reference clock until the data arrives at the first-in first-out buffer circuit.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1:
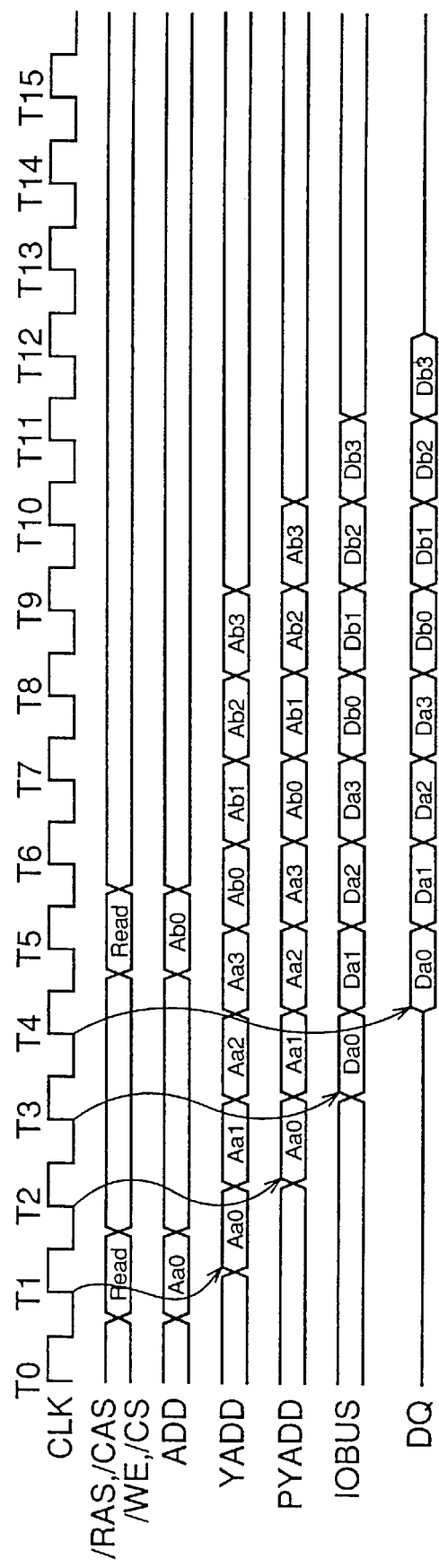
FIG. 1 is a timing chart for use in explaining a conventional pipeline system.
Figure 2:
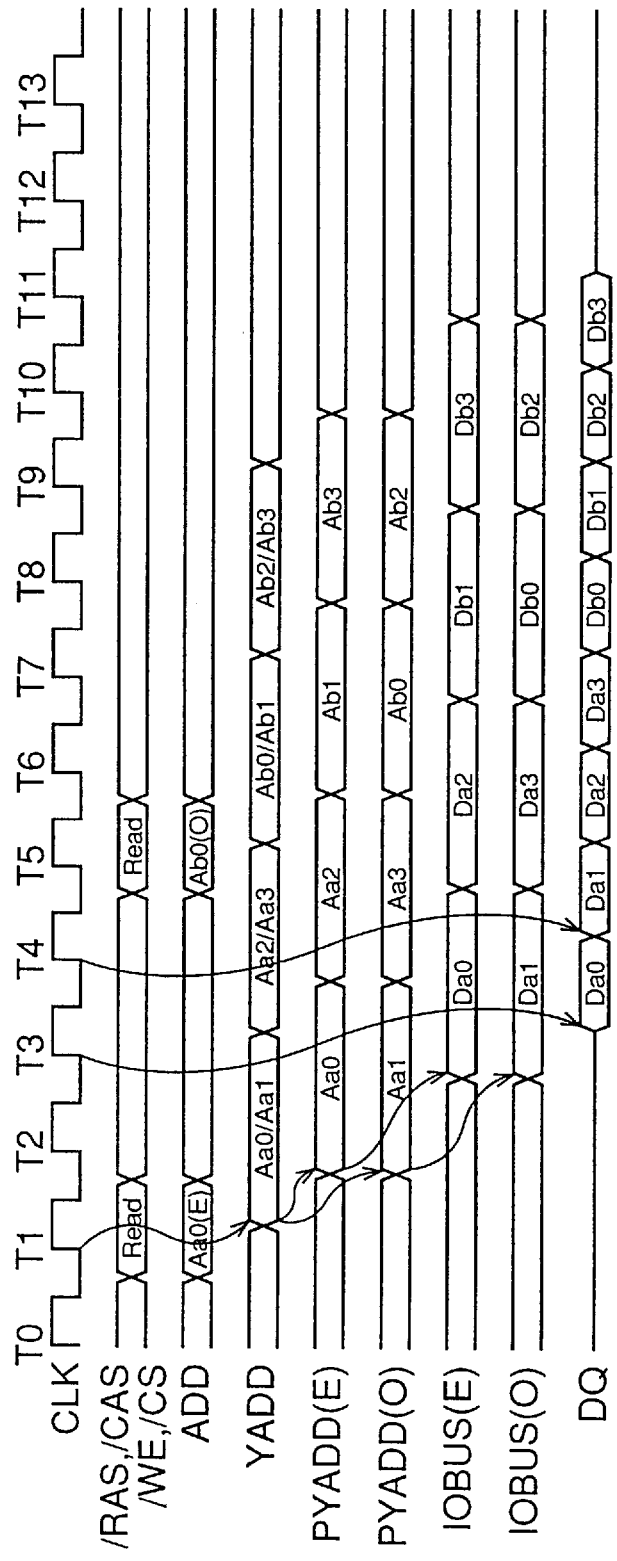
FIG. 2 is a timing chart for use in explaining a conventional prefetch system.
Figure 3:
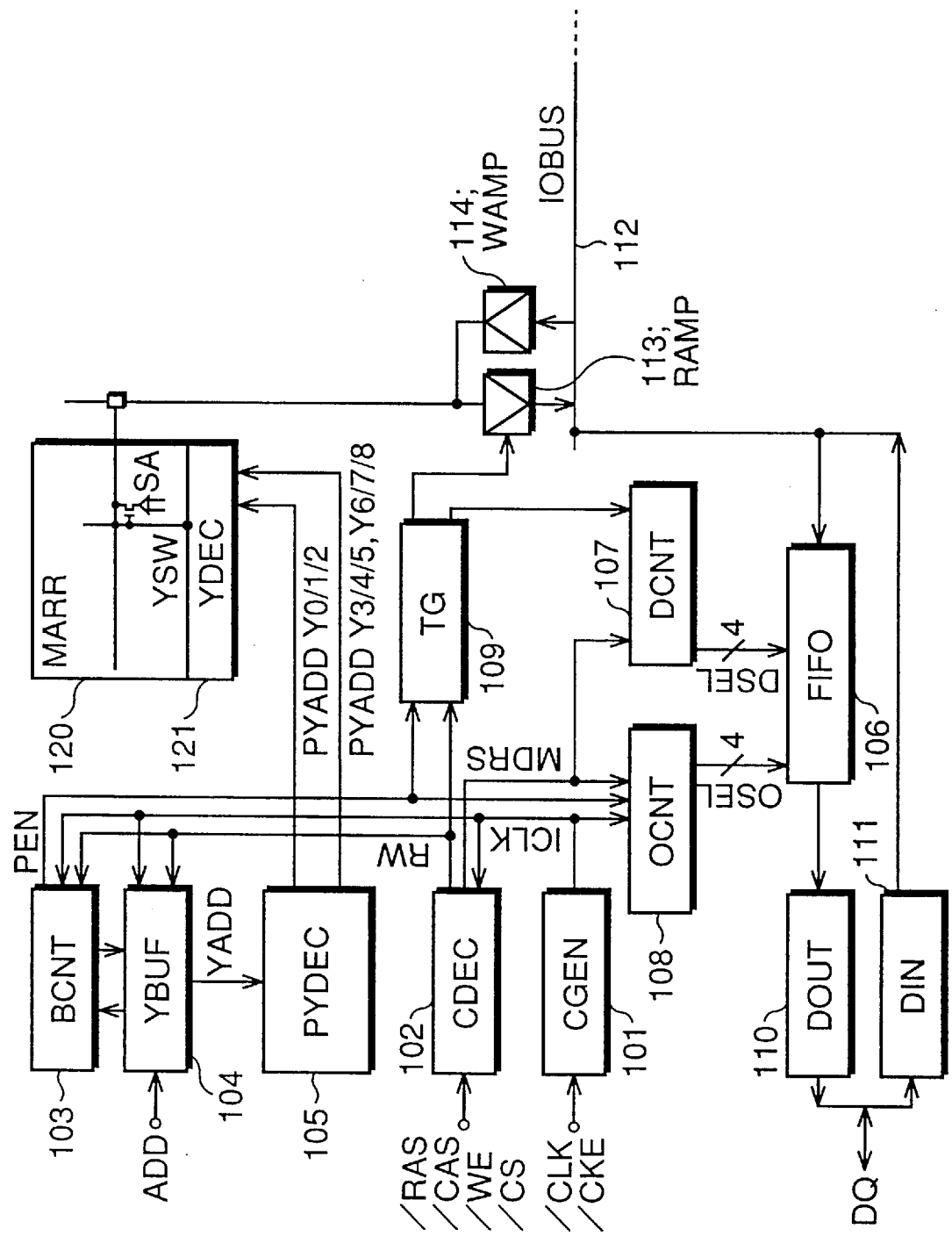
FIG. 3 is a block diagram for showing a structure of a device of a first embodiment according to the invention.
Figure 4:
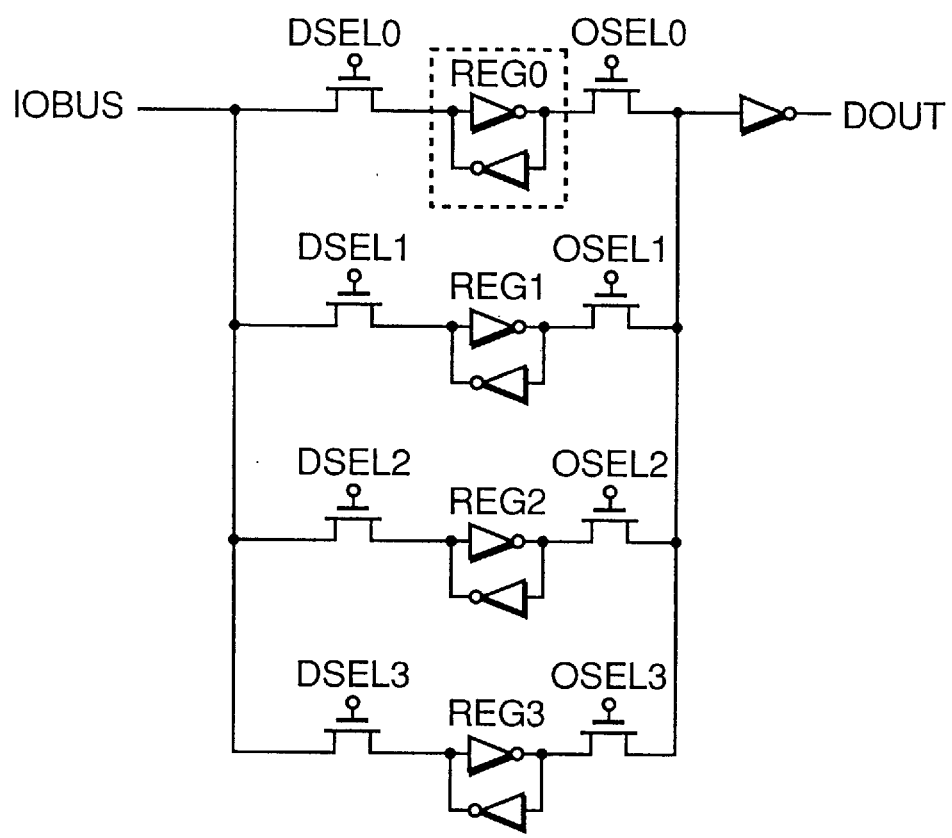
FIG. 4 is a circuit diagram for showing a structure of an FIFO buffer used in the device of the first embodiment according to the invention.
Figure 5:
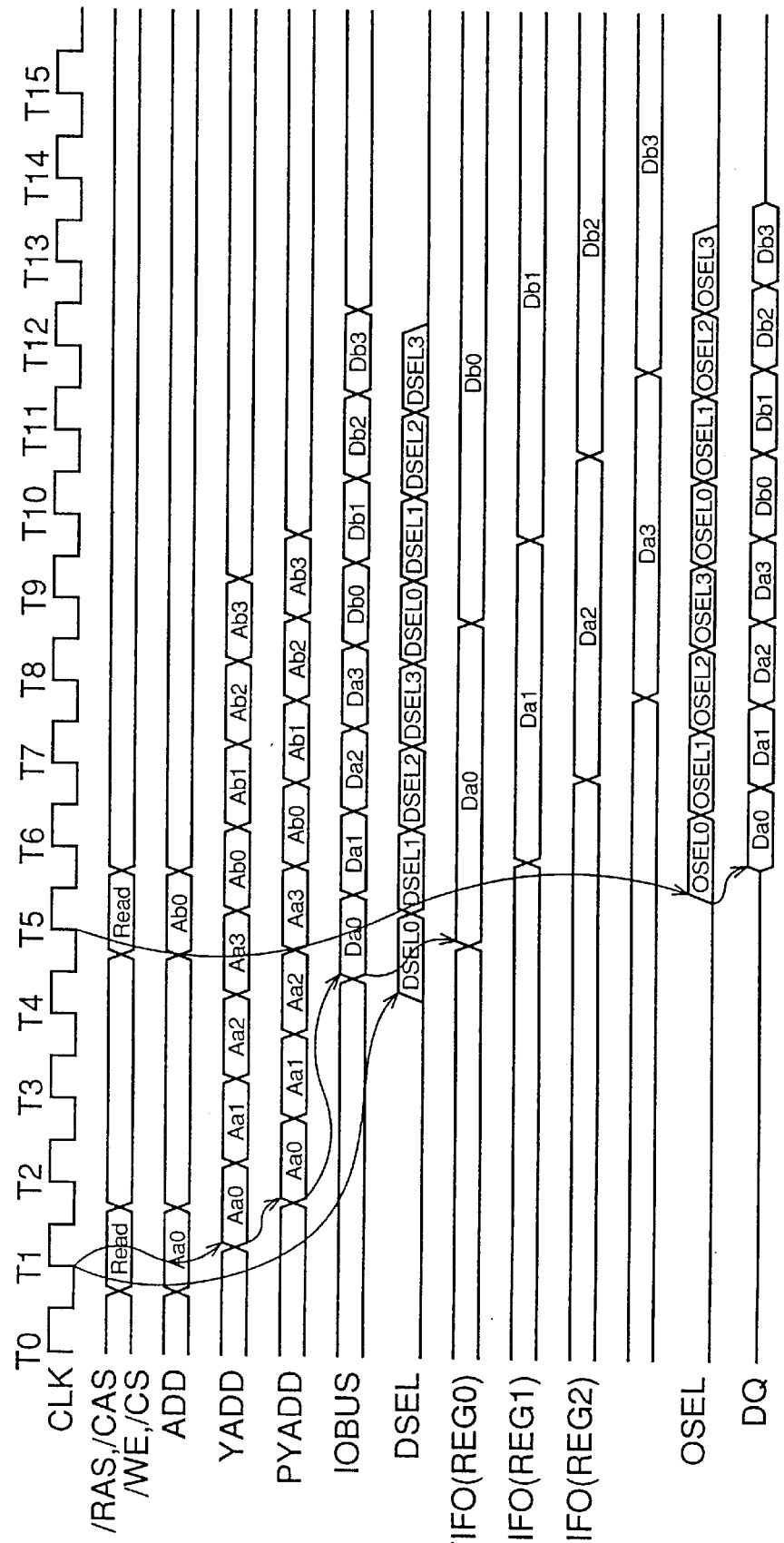
FIG. 5 is a timing chart for use in explaining the operation of the device of the first embodiment according to the invention.
Figure 6:
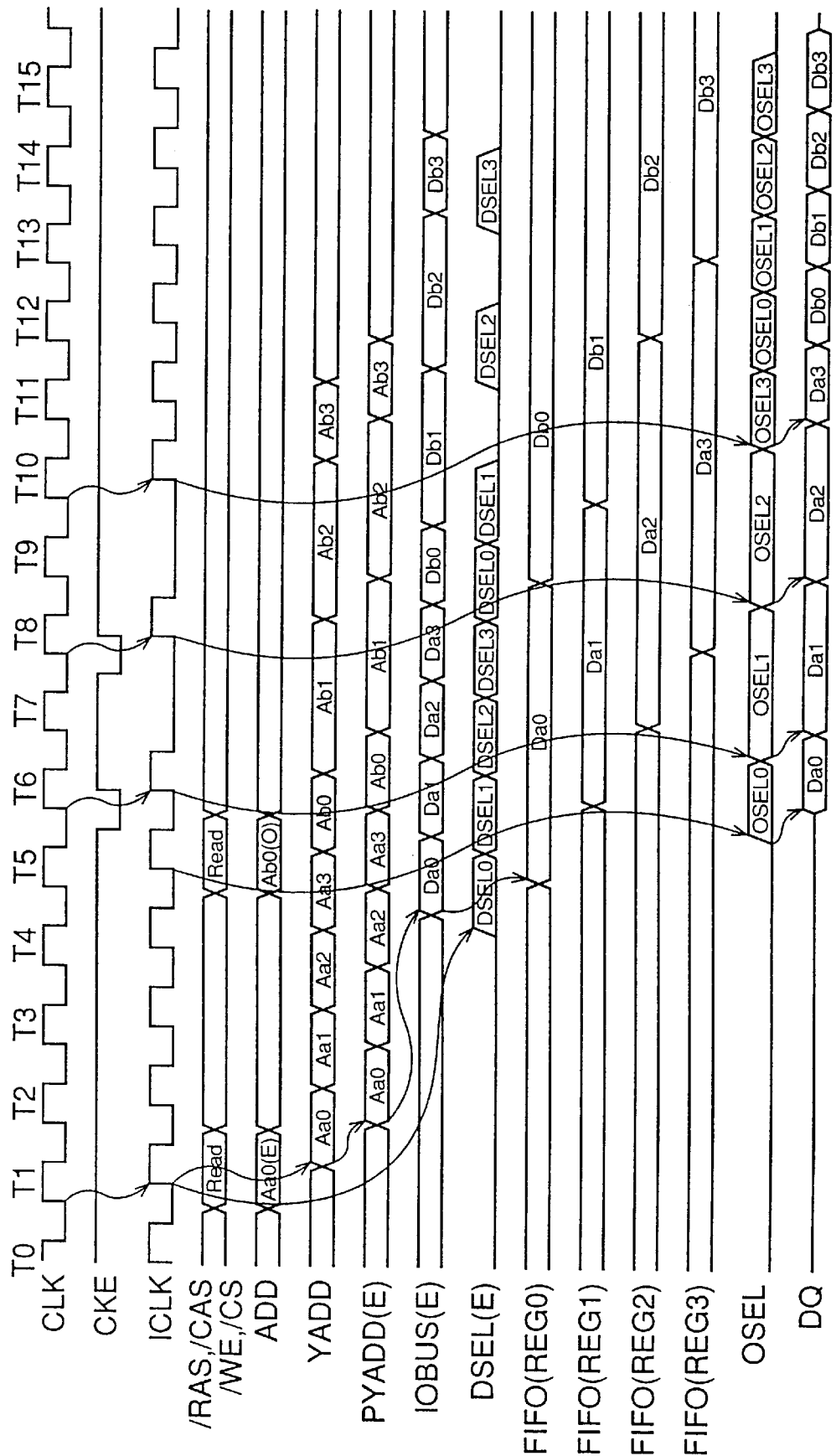
FIG. 6 is a timing chart also for use in explaining the operation of the device of the first embodiment according to the invention.
Figure 7:
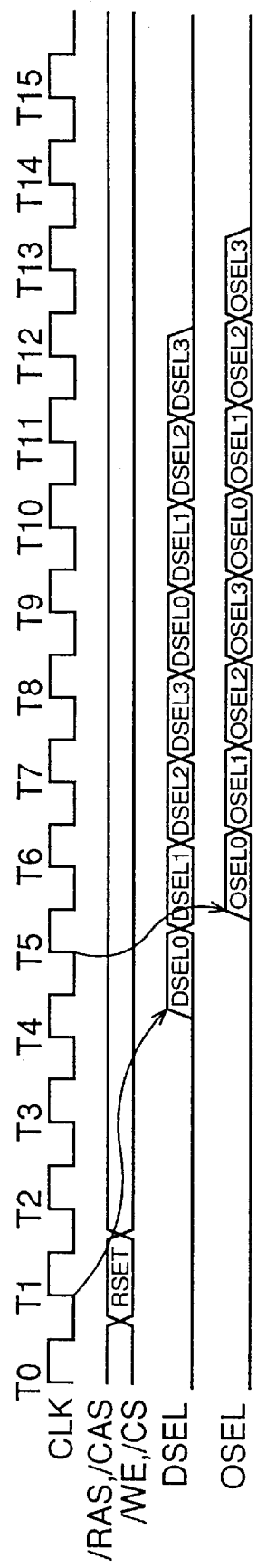
FIG. 7 is a timing chart also for use in explaining the operation of the device of the first embodiment according to the invention.

FIG. 3 shows, in a block diagram, a configuration of a device of a first embodiment according the invention. FIG. 4 is a circuit diagram showing a configuration of a first-in first-out (FIFO) buffer included in the device shown in FIG. 3. FIGS. 5 to 7 are timing charts for use in explaining the operation of the device of the first embodiment according to the invention.

The arrangements in the first embodiment are explained with reference to FIGS. 3 to 7. The explanation relates to a case wherein the column addresses are Y0–Y8, the maximum burst length is "8", and the maximum /CAS latency is "5", but these are only examples and any changes therein will have no effect on the feature of the invention. Further, no reference is made to the number of banks, and the number of DQ (number of input/output bits), but they are not directly relevant to the invention.

With reference to FIG. 3, the internal clock generating circuit (CGEN) 101 generates an internal reference clock signal ICLK from the reference clock signal CLK and the clock enable signal CKE which are inputted from the outside. If, at the time when the rising edge of the reference clock signal CLK is inputted, the CKE signal is low (for example, as cycle T6), the ICLK signal corresponding to the CLK signal of the next cycle (for example, as cycle T7) is not generated, as can be seen in FIG. 6.

The command decoder (CDEC) 102 takes-in external command signals /RAS (RAS (Row Address Strobe) bar), /CAS (CAS bar), /WE (Write Enable bar), and /CS (Chip Select bar) at the clock edges of the internal reference clock signals ICLK, decodes the commands that are given in combination with these signals from the outside, and generates internal signals corresponding to the respective commands. In the synchronous DRAM, although there are several kinds of commands such as activation commands, FIG. 3 shows only the RW signals which correspond to read/write commands and the MDRS signals which correspond to mode register set commands as those signals that are relevant to the invention.

The burst counter (BCNT) 103 generates, during the burst period, a signal PEN in the case where a RW signal is produced by the command decoder when the read command or the write command is given from the outside. Then, the burst counter 103 initializes the counter, causes the counter to operate in accordance with the subsequent internal reference clock signals ICLK, and continues to output the PEN signals during the burst period (ICLK cycle number period of the burst length).

The internal column address generating circuit (YBUF) 104 takes-in external column address ADD signals that are inputted simultaneously as read/write commands are inputted, generates as internal column address YADD signals the signals of the same values as those of the external column address ADD signals and, during the subsequent burst period, generates respective internal column address YADD signals corresponding to the ICLK cycles upon the inputting of the edges of the reference clock ICLK signals.

The column address pre-decoder (PYDEC) 105 generates pre-decoded column addresses PYADD in several pairs from the internal column address YADD.

The memory cell array (MARR) 120 is of a DRAM core. The column selection line YSW designated by the column address PYADD is activated, and the data of the desired memory cell that has been read out to the sense amplifier (SA) connected to the column selection line YSW is read out to the data input/output line (IOBUS) 112 through a read amplifier (RAMP) 113.

The FIFO buffer 106 is a reference clock synchronization output control FIFO (first-in and first-out type) buffer.

In the chip of the device in this embodiment, since the access time is at a high speed, the processes from the input of the command up to the point thus far explained have been carried out completely in asynchronization with the reference clocks. However, since the control of outputs is in synchronization with the reference clocks, the FIFO buffer solves the problem of data collisions caused by, for example, clock suspension.

FIG. 4 shows a circuit configuration of the FIFO buffer 106. As shown in FIG. 4, the FIFO buffer is constituted by four registers REG0–REG3.

In this embodiment, the maximum /CAS latency is "5" so that it is sufficient if four un-outputted data can be held at a maximum. This is because, if the reference clock is inputted in order to read out more data from MARR 120, the data must be outputted to outside the chip so that, eventually, it becomes unnecessary to hold the data outputted, and the register having been used for holding such data may be used for holding the data newly read out from the MARR 120.

Each of the registers is constituted by a flip-flop circuit, and has one input terminal and one output terminal. The input terminals are connected to a common data input/output bus (IOBUS) 112 so that the input terminals are controlled by a FIFO buffer data latch select line DSEL, and the data of the IOBUS is latched only by the registers that are controlled by the activated DSEL signal.

Also, the output-terminals are connected to a common data-out buffer (DOUT) 110 so that the output terminals are controlled by a FIFO buffer output control line OSEL, and the data of the FIFO buffer 106 is outputted only by the registers that are controlled by the activated OSEL signal.

With reference to FIG. 3, an FIFO buffer input control counter (DCNT) 107 controls the input of each register of the FIFO buffer 106. The DCNT 107 is a cyclic counter having states in which the same number of the registers as in the FIFO buffer 106 is provided, and takes the values of 0→1→2→3→0→ . . . in synchronization with the internal reference clocks ICLK, thus activating the DSEL signals corresponding to the respective values. Therefore, in the FIFO buffer 106, the input of the data input/output bus (IOBUS) 112 of the register that shows the value of the DCNT 107 becomes available.

A FIFO buffer output control counter (OCNT) 108 controls the output of each of the registers of the FIFO buffer 106. The OCNT 108 is also a cyclic counter having the same number of states as the number of the registers of the FIFO buffer, and takes the values of 0→1→2→3→0→ . . . in synchronization with the internal reference clocks ICLK, thus activating the OSEL signals corresponding to the respective values. Therefore, in the FIFO buffer 106, the values of the register which the OCNT 108 shows are outputted from the FIFO.

The DCNT 107 and the OCNT 108 operate independently from each other.

The timing generation circuit (TG) 109 generates, from the internal reference clocks ICLK with reference to such signals as RW signals and PEN signals, timing signals for the operation of such circuits as a read amplifier (RAMP) 113 and a DCNT 107 with the phase being matched with the data read-out from the memory cell array (MARR) 120.

The data-out buffer (DOUT) 110 is an output buffer circuit which outputs to the outside of the chip the data outputted from the FIFO buffer 106.

The data-in buffer (DIN) 111 is an input buffer circuit which latches the data inputted from the outside simultaneously with the writing operation and outputs it to the data input/output bus (IOBUS) 112.

Now, the operation of the memory device of this embodiment is explained with reference to the drawings. The input signal from the outside is the same as that in the known conventional synchronous DRAM.

FIG. 5 shows the operation which takes place in the case where no clock suspension is made by the clock enable signal CKE (that is, by making the level of the clock signals low so as to make the reference clock signal CLK of the next cycle invalid, the internal reference clock signal ICLK corresponding to this CLK is not generated and, thus, the internal operation corresponding to the CLK is not performed at all), and the read command is inputted twice at each of 4 clocks with the /CAS latency being "5" and the burst length being "4".

FIG. 6 is a timing chart of the operation in the case where the clock suspension is made while the remaining conditions are the same as those in the operation explained with reference to FIG. 5, and FIG. 7 is a timing chart of the operation in the case where the mode register set command is inputted.

The external reference clock signal CLK and the clock enable signal CKE for enabling the CLK signal are provided from the outside. The internal reference clock signal ICLK is generated from these signals by the internal clock generation circuit (CGEN) 10.

As shown in FIG. 6, even when the external reference clock signal CLK is provided from the outside, the internal reference clock signal ICLK is not generated unless the clock enable signal CKE is provided so that, even if the external reference clock signal CLK is provided at a constant period, the internal reference clock signal ICLK does not necessarily become the constant period. The circuits other than the internal clock generation circuit (CGEN) 101 are not operated by external reference clock signals CLK, but are operated by signals of the internal reference clock signal ICLK.

The external command signals (/RAS, /CAS, /WE, /CS) are provided from the outside. In FIGS. 5, 6 and 7, these four signals are shown together.

"Read" indicates an input of a read command. In practice, the /RAS is high level, the /CAS is low level, the /WE is high level and the /CS is low level.

Also, "RSET" indicates an input of a mode register set command. In practice, the /RAS is low level, the /CAS is low level, the /WE is low level and the /CS is low level.

Each of the signals is taken into the inside in accordance with the clock edges of the internal reference clock ICLK, and the command in combinations thereof is decoded.

The MDRS signal is generated when the mode register set command is inputted, and the RW signal is generated when the read command or write command is inputted.

The external address signal ADD is provided from the outside. Aa0 of the ADD signal upon the inputting of read command indicates the address of the leading burst data.

When the RW signal is generated by the inputting of the read command, the external address signal ADD is latched by the column address buffer circuit (YBUF) 104 whereby the internal column address signal YADD is generated.

At this time, the value of the internal column address signal YADD is the same as the value of the external address signal ADD, and indicates the address of the leading burst data.

When the burst counter (BCNT) 103 is reset, the recognition is made that the cycle of the internal reference clock signal ICLK is the leading of the burst operation and, during the subsequent cycle of the burst length of the ICLK signal, the burst enable signal PEN is generated.

During the subsequent period in which the PEN signal is effective, the column address buffer circuit (YBUF) 104 generates, in accordance with the ICLK, signals Aa1, Aa2, . . . as internal column address signals YADD subsequent to the second burst bit.

The internal column address signal YADD generated is pre-decoded by the column pre-decoder (PYDEC) 105 whereby several sets of pre-decode column address signals PYADD are generated.

The pre-decode column address signal (PYADD) is inputted to the column decoder (YDEC) 121, and activates the column select line YSW.

As a result, the data such as Da0 are read-out to the input/output bus (IOBUS) 112 of the data amplified by the read amplifier (RAMP) 113 from the sense amplifier (SA) to which the memory cells having the desired addresses are connected.

The control of the data path to this point is carried out such that, with respect to the leading burst data, the control is based solely on the edge of the internal reference clock signal ICLK at the inputting of the command and, with respect to the data subsequent to the second burst bit, the control is based solely on the edge of the corresponding internal reference clock signal ICLK subsequent to the inputting of the command.

That is, until the data is outputted to the input/output bus (IOBUS) 112 from the inputting of the command, the reference clock, irrespective of its cycle (unless the /CAS latency is not exceeded), is irrelevant to the data control.

Therefore, in this embodiment, the portion of the read control systems that has been explained above has no dependence at all on the /CAS latency.

Also, in this embodiment, absolutely no means for synchronizing the internal process to the internal reference clock signal ICLK is inserted in the data path.

However, in this embodiment, information relating to a plurality of data is processed in a given time (a cycle time) so that the system is a pipeline system.

Therefore, when the frequency of the internal reference clock signal ICLK becomes high, there are possibilities in which, during the internal processing, the next data comes before the processing of the previous data is completed. For example, there is a possibility for the PYADD changes to the next address before the data to be outputted to the data input/output bus (IOBUS) 112 is determined.

In the above case, a malfunction is likely to occur, but such is also true in a conventional example and, thus, is not a problem related to this embodiment. In this embodiment, the overhead against the synchronization operation of the internal reference clock signal ICLK between the stages as in the prior art example does not exist so that, to this extent, the maximum operation frequency becomes higher.

The data read-out to the data input/output bus (IOBUS) 112 is taken into the register of the FIFO buffer 106 shown by the FIFO buffer input control counter (DCNT) 107 which is controlled by the timing generation circuit (TG) 109 through a suitable means as explained later.

The data taken into the register is sent to the data-out buffer (DOUT) by the OSEL signal in accordance with the internal reference clock signal ICLK from the clock edge of the internal reference clock signal ICLK inputted for reading-out the data to the clock edge after the (/CAS latency–1) cycle.

Now, the control of FIFO 106 by the DCNT 107 and the OCNT 108 is explained.

The DCNT 107 and the OCNT 108 are initialized using as reference the ICLK signal to which the mode register set command is inputted. The mode register command is a command which performs the initialization and sets the operation mode of the synchronous DRAM, and it is guaranteed to be inputted prior to any operation.

As shown in FIG. 7, when the mode register set command is inputted at the time (cycle) T1, the DCNT 107 is set to a predetermined value (here "0") after a delay of a predetermined time from the edge of the ICLK for taking-in the mode register set command. This delay of the predetermined time is set to be essentially the same as the time that the DCNT 107 counts for taking into the FIFO 106 the data readout to the data input/output bus (IOBUS) 112 from the MARR 12 in accordance with the edge of the internal reference clock signal ICLK for taking-in the read command (Read) when it is inputted as explained later.

Also, after the number of (/CAS latency–1) cycles from the edge of the internal reference clock signal ICLK for taking-in the mode register set command, the OCNT 108 is set at the time T4 to the same value (here "0") as the initial value of the DCNT 107.

The number of (/CAS latency–1) cycles is, as shown in FIG. 5, the same as the number of cycles which the OCNT 108 counts at the time T5 for outputting from the FIFO 106 the data read-out from MARR in accordance with the edge of ICLK at the time T1 for taking-in the read command when it is inputted.

Therefore, the relationship between the DCNT 107 and the OCNT 108 at the completion of the initialization is such that, assuming that the read command is inputted at the time T1 at the clock edge of the internal reference clock signal ICLK used for the initialization, the data read-out from the MARR 120 is taken into the REG0 and is outputted at the time T5 after (/CAS latency–1) cycles from the inputting of the read command.

Thereafter, the DCNT 107 and the OCNT 108 are counted by the inputting of the internal reference clock ICLK.

In this case, for taking-in the value of the data input/output bus (IOBUS) 112, the DCNT 107 is counted at the timing of a predetermined delay from the internal reference clock signal ICLK.

Also, for outputting the data after (/CAS latency–1) cycles, the OCNT 108 is counted by the clock edge after (/CAS latency–1) cycles from the clock edge of the internal reference clock signal ICLK which counts the DCNT 107.

By the control as explained above, after the mode register set command is inputted, as shown in FIG. 6, the relationship as at the initialization with respect to respective data can be maintained irrespective of any frequency changes of the external reference clock signal CLK or the presence or non-presence of the clock suspension caused by the clock enable signal CKE.

As shown in FIG. 6, the data Da0 read from the memory cell array (MARR) 120 by the inputting of the read command at the time T1 is taken into the register REG0 of the FIFO buffer 106 by the DSEL0 signal and, in accordance with the input of the clock edge of the clock signal CLK at the time T5, is outputted to the outside by the OSEL0 signal.

Further, by the clock suspension through a low input of the clock enable signal CKE at the time T7, the time when the data Da1 read-out from the clock edge of the time T2 is used outside of the chip extends by one cycle from the time T7 to the time T8, but the change from the OSEL1 to the OSEL2 also extends by one cycle from T7 to T8 as compared with the case in which there is no clock suspension and thus the output is normal.

At this time, although the next data Da2 is taken into the FIFO buffer 106, this is a result of the control based on the clock edge of the time T3 and has no bearing on the clock suspension. Thus, the data Da2 is taken into the register REG3 of the FIFO buffer 106 without causing any collision with the data Da1.

That is, with respect to one data, the same register is always used for both the input and output of the FIFO buffer 106 and this guarantees the control of the correct data flow. Thus, there is absolutely no control system which is attributed to the input of a read command for the register selection of the FIFO buffer 106.

For the above reason, within the limits of the access time appropriately given to the frequency and the /CAS latency of the internal reference clock signal ICLK, the timing becomes one at which there is an overlap of the data of the data input/output bus (IOBUS) 112 and the signals DSEL and OSEL.

At this time, the data inputted simply passes through the inside of the FIFO buffer 106 and arrives at the data output buffer (DOUT) 110. Thus, the overhead with respect to the address access time for causing the data output to be synchronized with the internal reference clock signal CLK is only the delay involved in passing through within the FIFO buffer 106, and thus the overhead is very short.

Thereafter, the data outputted from the FIFO buffer 106 is outputted to the outside of the chip by the data output buffer (DOUT) 110 and this completes the series of the read operations. Then, the data is used at the outside at the timings of the clock edges from those of the internal reference clock signals ICLK inputted for reading and to those after the /CAS latency.

As explained above, in this first embodiment, the minimum necessary circuits are used in relation to the data path and, where such circuits are not necessary, it is possible to realize a high speed read system in which, since it is equipped with a mechanism for stopping the advancement of the data, the overhead with respect to the address access time is almost none in spite of the pipeline operation.

Further, there is no necessity for varying the timings of the transition control by, for example, the /CAS latency, and the maximum frequency of the ICLK signal at any /CAS latency is only the operating frequency of purely the DRAM core portion so that it is possible to raise the maximum burst transfer frequency. For the above reasons, the circuit can also be simplified resulting in the reduction of the chip area.

In this first embodiment, the initialization of the FIFO buffer control is carried out by the input of the mode register set command, but there is no problem even if this is carried out by, for example, the switching-in of the power source or the activation command input, which occurs in any case before the inputting of the read command.

Figure 8:
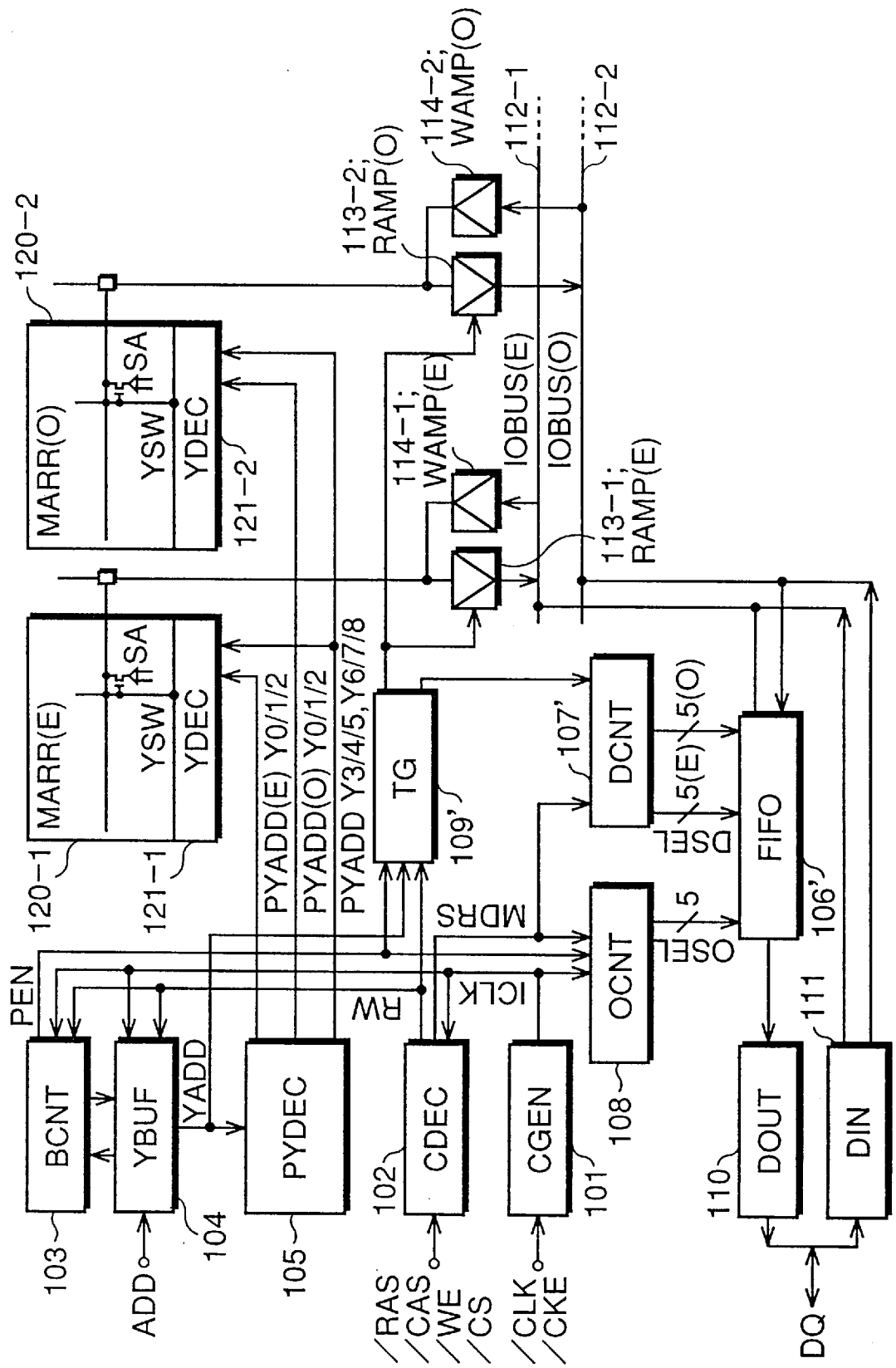
FIG. 8 is a block diagram for showing a structure of a device of a second embodiment according to the invention.
Figure 9:
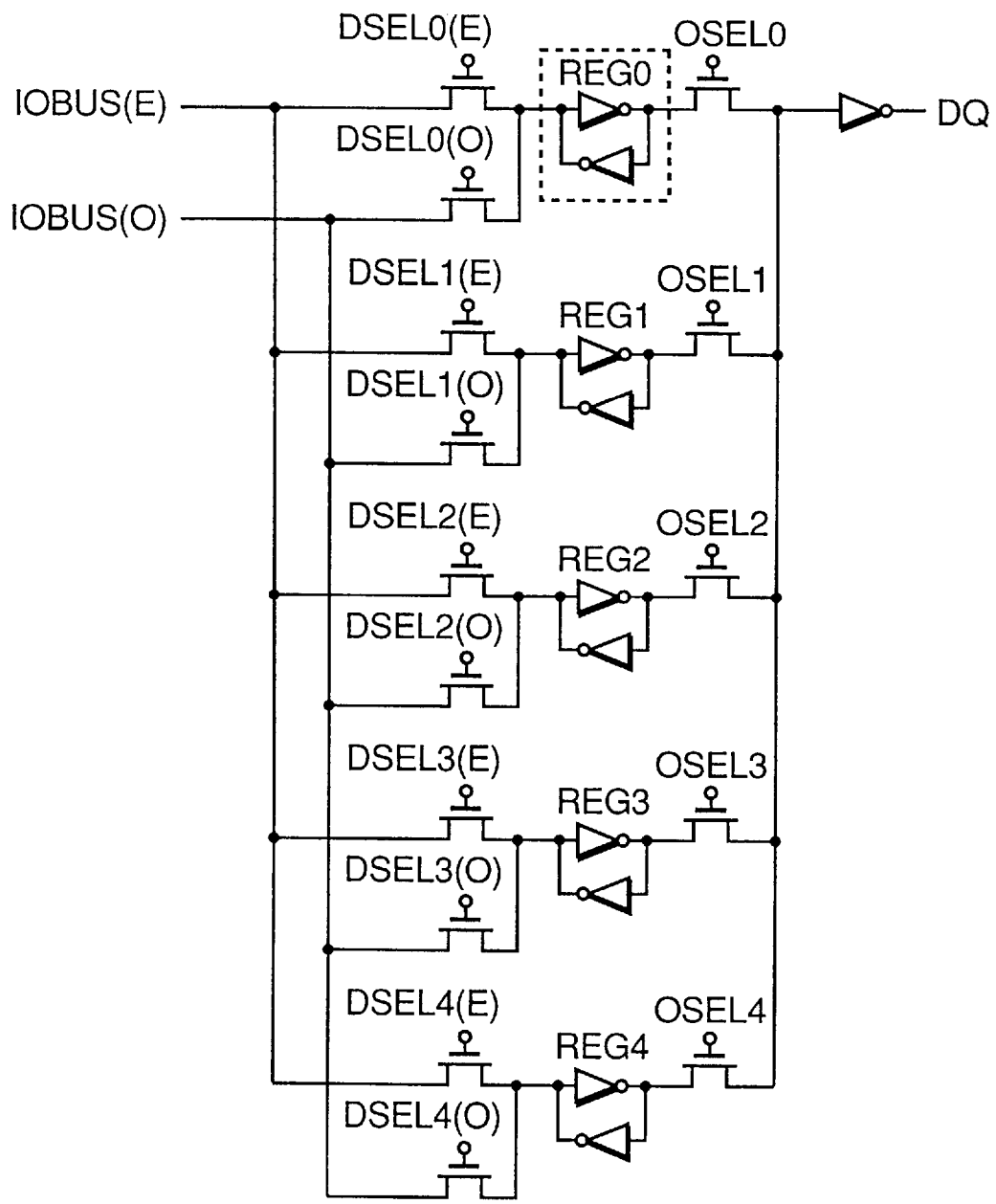
FIG. 9 is a circuit diagram for showing a structure of an FIFO buffer used in the device of the second embodiment according to the invention.
Figure 10:
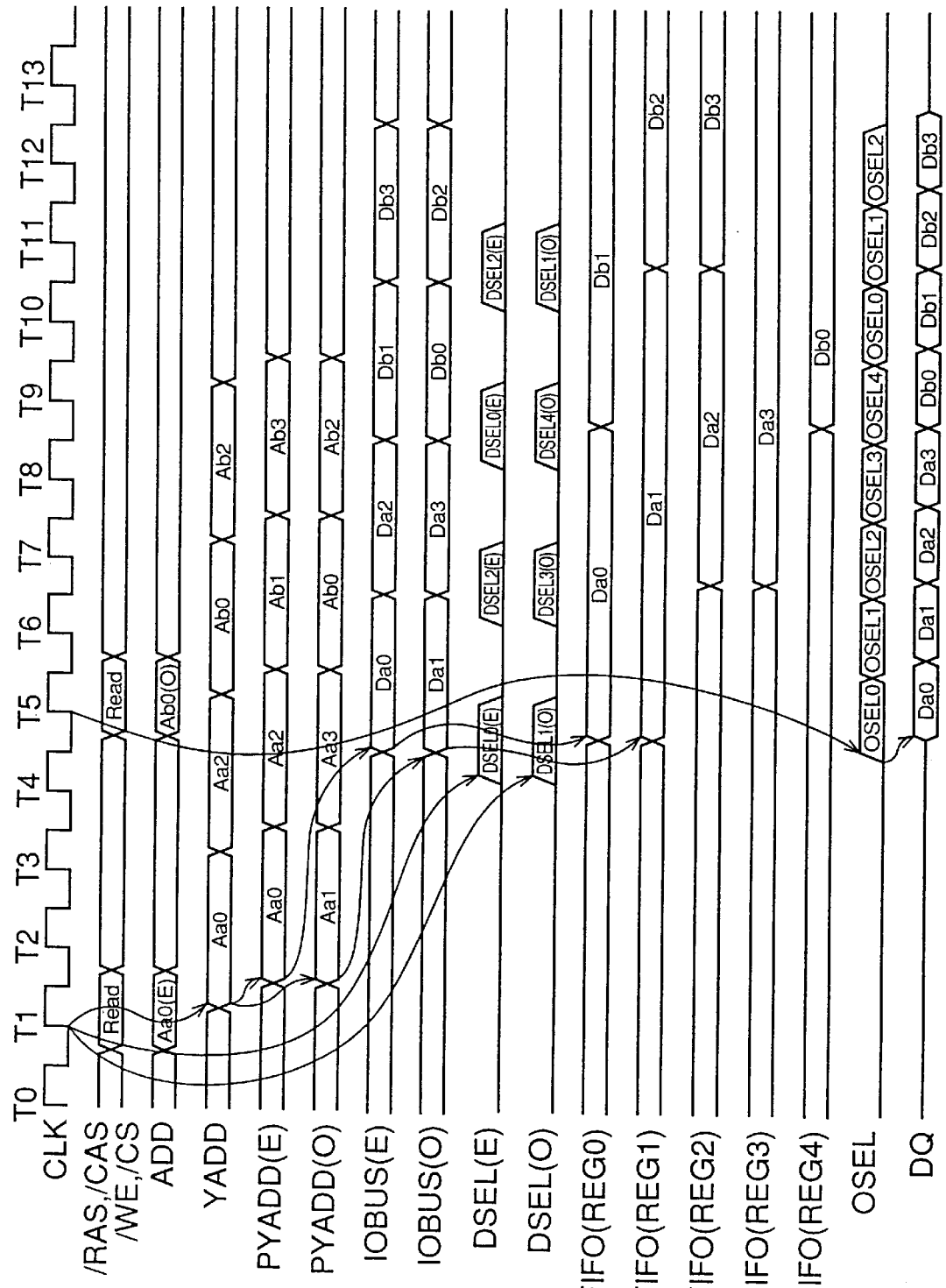
FIG. 10 is a timing chart for use in explaining the operation of the device of the second embodiment according to the invention.
Figure 11:
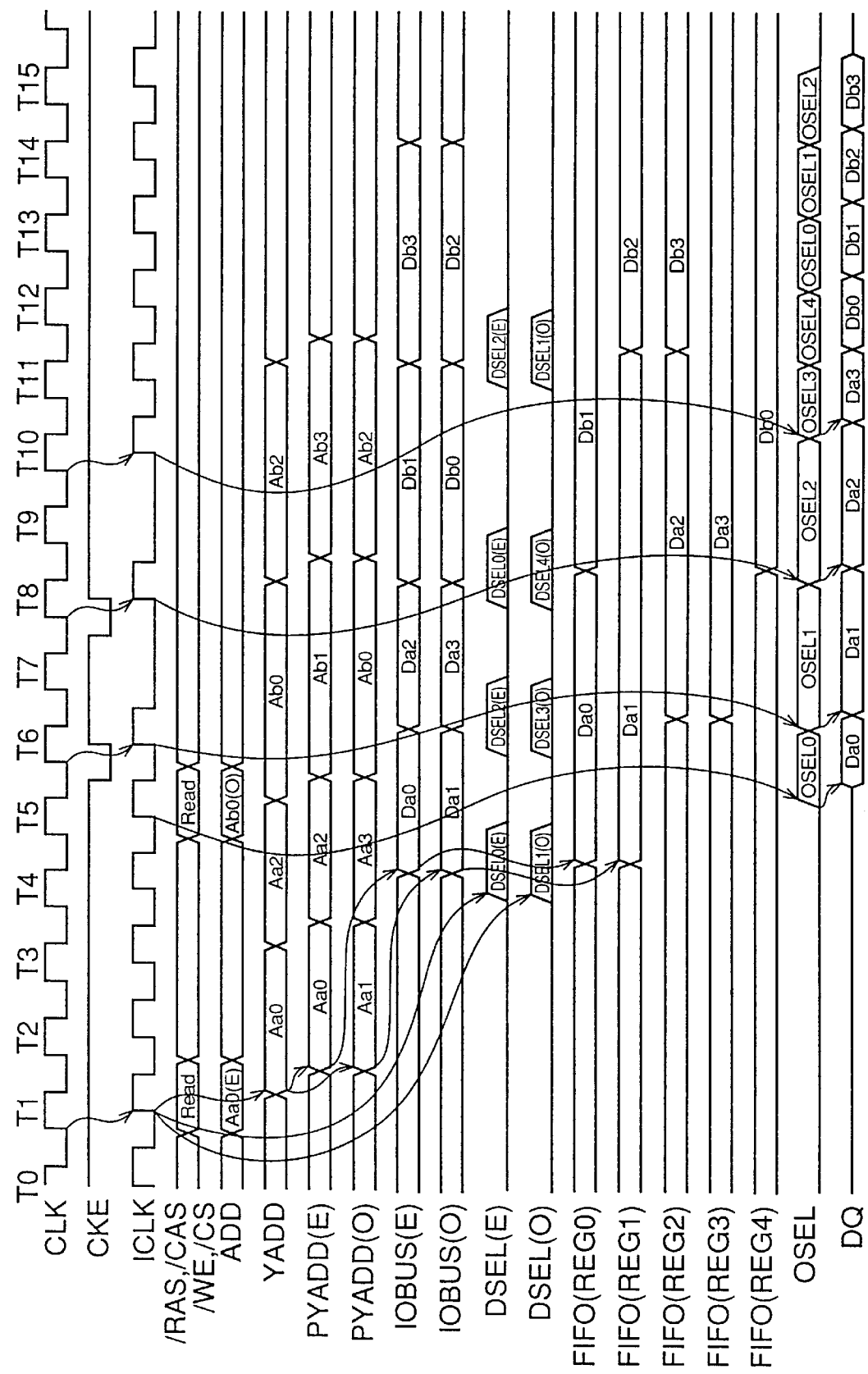
FIG. 11 is a timing chart also for use in explaining the operation of the device of the second embodiment according to the invention.

FIG. 8 shows, in a block diagram, a configuration of a device of a second embodiment according the invention. FIG. 9 is a circuit diagram showing a configuration of a first-in first-out (FIFO) buffer included in the device shown in FIG. 8. FIGS. 10 and 11 are timing charts for use in explaining the operation of the device of the second embodiment according to the invention.

The arrangements in the second embodiment are explained with reference to the drawings. The explanation relates to a case wherein the column addresses are Y0–Y8, the maximum burst length is "8", the maximum /CAS latency is "5" and the number of prefetches is "2", but even if these are changed, the system will not be affected. Further, no reference is made to the number of banks, and the number of DQ (number of input/output bits), but they are not directly relevant to the system.

With reference to FIG. 8, the internal clock generating circuit (CGEN) 101 generates an internal reference clock signal ICLK from the reference clock signal CLK and the clock enable signal CKE which are inputted from the outside. If, at the time when the rising edge of the reference clock signal CLK is inputted, the CKE signal is low, the ICLK signal corresponding to the next cycle is not generated, as can be seen in FIG. 11.

The command decoder (CDEC) 102 takes-in external command signals /RAS, /CAS, /WE, and /CS at the clock edges of the internal reference clock signals ICLK, decodes the commands that are given in combination with these signals from the outside, and generates internal signals corresponding to the respective commands. In the synchronous DRAM, although there are several kinds of commands such as activation commands, FIG. 8 shows only the RW signals which correspond to read/write commands and the MDRS signals which correspond to mode register set commands as those signals that are relevant to the invention.

The burst counter (BCNT) 103 generates, during the burst, a signal PEN in the case where a RW signal is produced by the command decoder when the read command or the write command is given from the outside. Then, the burst counter 103 initializes the counter, causes the counter to operate in accordance with the subsequent internal reference clock signals ICLK, and continues.to output the PEN signals during the burst period (ICLK cycle number period of the burst length).

The internal column address generating circuit (YBUF) 104 takes-in external column address ADD signals that are inputted simultaneously as read/write commands are inputted, generates as internal column address YADD signals the signals of the same values as those of the external column address ADD signals and, during the subsequent burst period, generates respective internal column address YADD signals corresponding to the ICLK cycles upon the inputting of the edges of the reference clock ICLK signals. Therefore, as shown in FIG. 10, in the case where the edge of the internal reference clock signal ICLK which takes-in the read command is made a first edge, there are generations of internal column address signals YADD corresponding to the edges of the internal reference clock signals ICLK of Aa0, Aa2, . . . out of the addresses of the data that are burst-outputted, that is, odd number addresses of the data that are burst-outputted, but there are no generations of internal column address signals YADD corresponding to the edges of the internal reference clock signals ICLK of Aa1, Aa3, . . . which are even number addresses of the data and, as a result, the value of the internal column address signal YADD corresponding to the internal reference clock signal ICLK of the immediately preceding odd number address is maintained. Thus, the operation of the address system signals subsequent to the generation of the internal column address signal YADD is carried out with the 2 cycles of the internal reference clock signals ICLK being one unit.

The column address pre-decoder (PYDEC) 105 generates pre-decoded addresses PYADD in several pairs from the internal column address YADD. Simultaneously therewith, the column address pre-decoder (PYDEC) 105 generates, together with the column address Aa0, etc. of the odd number burst data indicated by the internal column address signal YADD, the column address Aa1, etc. of the even number burst data that is outputted next thereto. Although the values in combination vary depending on the burst length and the burst mode, the sequence of the column addresses of a series of data that are burst-outputted in the synchronous DRAM always alternates odd/even numbers, that is, in the alternating relationship between the odd and even numbers.

Thus, out of 8 column address signals PYADD (the number being the cube of 2) resulting from the pre-decoding of lower 3 bits Y0/1/2 that are necessary for the realization up to 8 bits burst that have been pre-decoded, the total number of the addresses simultaneously selected is two which consist of one of 4 even number addresses (Y0=0, PYADD(E)) and one of 4 odd number addresses (Y0=1, PYADD(O)). The other address bits that do not include Y0/1/2 are in common at the burst even number and odd number so that the pre-decode column address signal PYADD may also be in common.

The memory cell arrays (MARR) 120 are of DRAM cores. They are divided into even number column address sub-arrays MARR(E) 120-1 and odd number column address sub-arrays MARR(O) 120-2 with respect to each of the banks and DQs.

The MARR(O) 120-2 is constituted by memory cells having all odd number column addresses (Y0=1) and the MARR(E) 120-1 by memory cells having all even number column addresses (Y0=1).

By the even number/odd number pre-decoded addresses PYADD produced simultaneously at the column address predecoder (PYDEC) 105, the column select lines YSW of the respective odd/even number MARR 120-1 and 120-2 are simultaneously activated, and the data of the desired memory cells read-out to the sense amplifier SA connected to the column select lines YSW are simultaneously read-out to the even number column address data input/output bus IOBUS(E) 112-1 and the odd number column address data input/output bus IOBUS(O) respectively through the read amplifiers (RAMP) 113-1 and 113-2.

Thus, in the DRAM cores as a whole, two data per DQ are read-out in parallel at each read-out operation. Therefore, when the operation is carried out using 2 cycles of the internal reference clock signal ICLK, it is possible to read the data for the continuous data output.

The FIFO buffer 106' is a reference clock synchronization output control FIFO buffer. In this second embodiment, in order to speed up the access time, the processes after the command input thus far explained are carried out completely in asynchronization with respect to the reference clocks. However, since the output control is in synchronization with the reference clocks, it is possible to avoid, by the FIFO buffer 106', the occurrence of the data collision caused by, for example, the clock suspension.

Further, in this second embodiment, the FIFO buffer 106' also has a function of making the parallel-to-serial conversion that is necessary for the prefetch operation.

Now, the configuration of the FIFO buffer 106' is explained with reference to FIG. 9.

As shown in FIG. 9, the FIFO buffer is constituted by five registers REG0–REG4. In this second embodiment, the maximum /CAS latency is "5" so that when the prefetch operation is not taken into account, it is sufficient if four un-outputted data can be held at a maximum. This is because, if the reference clock is inputted in order to read out more data from MARR, the data must be outputted to outside the chip because of the relation with /CAS latency so that, as a result, it becomes unnecessary to hold the data outputted, and the register having been used for holding such data may be used for holding the data newly read out from the MARR.

However, in this second embodiment, despite the fact that, since the 2 bits prefetch is carried out, each of the registers has the data to be held, there are cases wherein two data are read-out from the MARR 120-1 and the MARR 120-2 because the input of the internal reference clock signal ICLK is for outputting one data. For this reason, one register is additionally provided.

Each of the registers REG0–REG4 is constituted by a flip-flop and has two input terminals and one output terminal. Of the two input terminals of each register, one is connected to the even number column address data input/output bus IOBUS(E) 112-1 and the other is connected to the odd number column address data input/output bus IOBUS (O) 112-2, and the input terminal is controlled by the FIFO buffer data latch select line DSEL so that the data of the IOBUS at the side connected is latched only by the register controlled by the activated DSEL signal.

Further, each of the output terminals is connected to the common data output buffer (DOUT) 110, and the output terminal is controlled by the FIFO buffer output control line OSEL so that only the register that has been controlled by the activated OSEL signal carries out the data output from the FIFO buffer 106'.

DCNT 107' controls the input of each register of the FIFO buffer 106'. DCNT 107' is a recycle counter having states in which the same number of the registers as in the FIFO 106' is provided, and takes the values 0→1→2→3→4→0→ . . . in synchronization with the internal reference clock signals ICLK.

Then, when the internal column address YADD is of the even number, the DSEL for controlling the input of the IOBUS(E) side of the register which the value of the DCNT 107' indicates and the register which the value of (DCNT+1) indicates are activated or, when the DCNT is of 4, the DSEL for controlling the IOBUS(O) of a 0 number register is activated. In the case where the internal column address YADD is of the odd number, the DSEL which controls the input of each register at the other side of the IOBUS is activated.

OCNT 108 controls the input of each register of the FIFO buffer 106'. OCNT 108 is also a recycle counter having states in which the same number of the registers as in the FIFO register is provided, and takes the values 0→1→2→3→4→0→ . . . in synchronization with the internal reference clock signals ICLK. Then, the OSEL signals corresponding to each of the values are activated. Thus, at the FIFO buffer 106', the values of the register which the values of the OCNT 108 indicate are outputted.

The DCNT 107' and the OCNT 108 operate completely independent from each other.

The timing generation circuit (TG) 109' generates operation timing signals for the read amplifiers (RAMP) 113-1 and 113-2, the DCNT 107', etc. with the timings being matched with the data read-out from the MARR(E) 120-1 and the MARR(O) 120-2 through the internal clock signals ICLK with reference to RW signals, PEN signals, YADD signals, etc.

The data output buffer (DOUT) 110 is an output buffer circuit which outputs to the outside of the chip the data outputted from the FIFO buffer 106'.

The data-in buffer (DIN) 111 is an input buffer circuit which latches the data inputted from the outside during the read operation and outputs them to the data output buses IOBUS 112-1 and 112-2.

Now, the operation of the memory device of this second embodiment is explained with reference to the drawings.

The input signal from the outside is the same as that in the known conventional synchronous DRAM.

FIG. 10 shows the operation which takes place in the case where no clock suspension is made by the clock enable signal CKE (that is, by making the level of the CKE signals low so as to make the external reference clock signal CLK of the next cycle invalid, the internal reference clock signal ICLK corresponding to the CLK is not generated and, thus, the internal operation corresponding to the external clock signal CLK is not performed at all), and the read command is inputted twice at each of the 4 clocks with the /CAS latency being "5" and the burst length being "4".

FIG. 11 is a timing chart of the operation in the case where the clock suspension is made while the remaining conditions are the same as those in the operation explained with reference to FIG. 10.

The external reference clock signal CLK and the clock enable signal CKE for enabling the CLK signal are provided from the outside. The internal reference clock signal ICLK is generated from these signals by the internal clock generation circuit (CGEN) 10.

As shown in FIG. 11, even when the external reference clock signal CLK is provided from the outside, the internal reference clock signal ICLK is not generated unless the clock enable signal CKE is provided so that, even if the external reference clock signal CLK is provided at a constant period, the internal reference clock signal ICLK does not necessarily become the constant period. The circuits other than the internal clock generation circuit (CGEN) 101 are not operated by external reference clock signals CLK, but are operated by signals of the internal reference clock signal ICLK.

The external command signals (/RAS, /CAS, /WE, /CS) are provided from the outside. In FIGS. 10 and 11, these four signals are shown together. "Read" indicates the input of a read-out command and, in practice, /RAS is at a high level, /CAS is at a low level, /WE is at a high level and /CS is at a low level.

Respective signals are taken into the inside in accordance with the clock edges of the internal reference clock ICLK, and the command in respective combinations is decoded. The MDRS signal is generated when the mode register set command is inputted, and the RW signal is generated when the read command or write command is inputted.

The external address signal ADD is provided from the outside. Aa0 of the external address signal ADD upon the inputting of read command indicates the address of the leading burst data.

When the RW signal is generated by the inputting of the read command, the external address signal ADD is latched by the column address buffer circuit (YBUF) 104 whereby the internal column address signal YADD is generated. At this time, the value of the internal column address signal YADD is the same as the value of the external address signal ADD, and indicates the address of the leading burst data.

When the burst counter (BCNT) 103 is reset, the recognition is made that the cycle of the internal reference clock signal ICLK is the leading of the burst operation and, during the subsequent cycle of the burst length of the ICLK signal, the burst enable signal PEN is generated.

During the subsequent period in which the burst enable signal PEN is effective, the column address buffer circuit (YBUF) 104 generates, in accordance with the internal reference clock signal ICLK, burst odd number internal column address signals Aa2, . . . in every two cycles.

The internal column address signal YADD generated is pre-decoded by the column pre-decoder (PYDEC) 105 whereby several sets of pre-decode column address signals PYADD are generated.

FIG. 10 shows that the read command is inputted twice. At the first read command at the time T1 where the external address signal ADD is an even number address Aa0, this address Aa0 as the leading burst data is outputted to the pre-decode column address signal PYADD(E) and the address Aa1 of the second burst data is outputted to the pre-decode column address signal PYADD(O). On the other hand, at the second read command at the time T5 where the external address signal ADD is an odd number address Ab0, this address Ab0 as the leading burst data is outputted to the pre-decode column address signal PYADD(O) and the address Ab1 of the second burst data is outputted to the pre-decode column address signal PYADD(E).

As to the pre-decode column address signal PYADD, PYADD(E) and PYADD(O) are inputted respectively to the column decoder (YDEC) 121-1 of MARR(E) 120-1 and the column decoder (YDEC) 121-2 of MARR(O) 120-2. Then, each of column selection lines YSW is activated.

As a result, the data Da0 which is designated by the data Aa0 from the sense amplifier (SA) to which the memory cell having the desired address is connected and the data Da1 which is designated by the address of the data Aa1 are amplified by the read amplifiers (RAMP) 113-1 and 113-2, and are read-out to the respective data input/output buses IOBUS(E) 112-1 and IOBUS(O) 112-2.

With respect to the leading and the second burst data, the data path control to the point thus far is carried out based only on the edges of the internal reference clock signals ICLK all during the inputting of the command and, with respect to the data subsequent to the third burst bit, the data path control is carried out based only on the odd number edges of the corresponding internal reference clock signals ICLK subsequent to the inputting of the command.

That is, until the data is outputted to the input/output bus (IOBUS) from the inputting of the command, the reference clock, irrespective of its cycle (unless the /CAS latency is not exceeded), is irrelevant to the data control.

Therefore, in this second embodiment, the portion of the read control systems that has been explained above has no dependence at all on the /CAS latency.

Also, in this second embodiment, absolutely no means for synchronizing the output to the internal reference clock signal ICLK is inserted in the data path.

Therefore, when the frequency of the internal reference clock signal ICLK becomes high, there are possibilities in which, at the portion where the internal processing is involved, the next data comes before the processing of the previous data is completed at the portion. For example, there is a possibility for the PYADD changes to the next address before the data to be outputted to the data input/output bus (IOBUS) is determined. In this case, a malfunction is likely to occur, but such is also true in a conventional example and, thus, is not a problem related to this embodiment.

In this embodiment, the overhead against the synchronization operation of the internal reference clock signal ICLK between the stages as in the prior art example does not exist so that, to this extent, the maximum operation frequency becomes higher.

The two data that are simultaneously read-out to the data input/output buses IOBUS(E) 112-1 IOBUS(O) 112-2 are taken into the two registers of the FIFO buffer 106' shown by the DCNT 107' which has been controlled in advance by the timing generation circuit (TG) 109 through a suitable means as explained later. At this time, the two data are taken into the FIFO in the sequence in which the two data are outputted.

Now, the control of the FIFO buffer 106' by the DCNT 107' and the OCNT 107 is explained.

The initialization procedure for the DCNT 107' and the OCNT 108 is the same as that in the first embodiment.

Thereafter, the DCNT 107' and the OCNT 108 are counted by the inputting of the internal reference clock ICLK. In this case, for taking-in the value of the data input/output bus (IOBUS), the DCNT 107' is counted at the timing of a predetermined delay from the internal reference clock signal ICLK.

However, since the reading of the data to the data input/output bus (IOBUS) is once pet two cycles of the internal reference clock signal, the DSEL signal is in practice activated once per two cycles of the internal reference clock signal ICLK. At this time, the two data on the even data input/output bus IOBUS(E) 112-1 and the odd data input/output bus IOBUS(O) 112-2 are taken into the FIFO buffer 106', using the procedure explained later, after parallel-serial conversion.

Also, for outputting the data after (/CAS latency–1) cycles, OCNT 108 is counted by the clock edge after (/CAS latency–1) cycles from the clock edge of the internal reference clock signal ICLK which counts DCNT 107'.

By the control as explained above, after the mode register set command is inputted, as shown in FIG. 11, the relationship as at the initialization with respect to respective data can be maintained irrespective of any frequency changes of the external reference clock signal CLK or the presence or non-presence of the clock suspension caused by the clock enable signal CKE.

As shown in FIG. 11, the data Da0 (even number address) read from the memory cell array MARR(E) 120-1 by the inputting of the read command accompanying the even number column address Aa0 at the time (cycle time) T1 is taken into the register REG0 of the FIFO buffer 106' by the DSEL0(E) signal, and the data Da1 (odd number address) read from the memory cell array MARR(O) 120-2 is taken into the register REG1 by the DSEL1(O) signal.

That is, Da0 is taken into the FIFO buffer so as to be outputted first. The data Db1 (even number address) readout by the MARR(E) through the read-out command accompanied by the odd number column address Ab0 at the time T5 is taken into the register REG0 of the FIFO buffer 106' the DSEL0(E) signal, and Db1 (odd number address) is taken into the register REG4 by DSEL4(O) signal. That is, Db0 is taken into the FIFO buffer 106' so as to be outputted first.

Da0 is outputted to the outside by the OSEL0 signal based on the input of the edge of the CLK at the time (cycle time) T5, and Da0 is outputted to the outside by the OSEL1 signal based on the input of the edge of the outside CLK signal at the time (cycle time) T6.

Further, by the clock suspension through a low input of the clock enable signal CKE at the time T7, the time when the data Da1 read-out from the clock edge of the time T2 is used outside of the chip extends by one cycle from the time T7 to the time T8, but the change from the OSEL1 to the OSEL2 also extends by one cycle from T7 to T8 as compared with the case in which there is no clock suspension and thus the output is normal. At this time, although the next data Da2 is taken into the FIFO buffer 106', this is a result of the control based on the clock edge of the time T3 and has no bearing on the clock suspension. Thus, the data Da2 is taken into the register REG3 of the FIFO buffer 106' without causing any collision with the data Da1.

That is, with respect to one data, the same register is always used for both the input and output of the FIFO buffer 106' and this guarantees the control of the correct data flow. Thus, there is absolutely no control system which is attributed to the input of a read command for the register selection of the FIFO buffer 106'.

The initialization and the counting are the processes which take place within the counter and which last in a short time so that, even if the frequency of the internal reference clock signal ICLK becomes high, there is sufficient time for one process per cycle to be completed.

With the above control, irrespective of any change in the frequency of the external clock signal CLK or of the presence or non-presence of the clock suspension by the clock enable signal CKE, the common register both for the input and the output is always used with respect to one data, and thus the control of the correct data flow is guaranteed.

The limits of the access time with an appropriate reference clock frequency and /CAS latency are the timings at which the signal DSEL of the register of the FIFO buffer which latches the data of each of and both of the even and odd number buses IOBUS overlaps the signal OSEL of the register in which, between the two data, the data to be outputted first is stored.

At this time, the data inputted first simply passes through the inside of the FIFO buffer and arrives at the data output buffer (DOUT) 110. Thus, the overhead with respect to the address access time (from the time when the address is provided from the outside to the time when the data is outputted) is, as in the first embodiment wherein no fetch is carried out, only the delay involved in passing through within the FIFO buffer 106', and thus the overhead is very short.

As explained above, in this second embodiment, the main processing of read operation, particularly such as the processing of the column address signal YADD and the pre-decode column address signal PYADD and the processing of reading data out of MARR to the data input/output bus (IOBUS), may be carried out by using up the time corresponding to 2 cycles of the internal reference clock signal ICLK.

In this way, in this second embodiment, the operation is still guaranteed even if the frequency of the internal reference clock signal is made two times that in the first embodiment. Thus, the maximum value of the burst transfer speed in the case where the same internal reference clock signal ICLK frequency is used, becomes two times that in the first embodiment.

In this second embodiment, the initialization of the FIFO buffer control is carried out by the input of the mode register set command, but there is no problem even if this is carried out by, for example, the switching-in of the power source or the activation command input, which occurs in any case before the inputting of the read command.

As explained above, in the memory element having the burst transfer mode, even when the address access time is constant, it is possible to increase the burst transmission frequency by using the reference clock of high frequency and increasing the /CAS latency number.

However, in the case where the system is operated by a low frequency (which is necessitated depending on conditions relating to other elements or substrate), if the /CAS latency is large, the time required up to the time of the outputting of the leading burst data is longer than the actual address access time.

Therefore, it is necessary for the system to be used with the /CAS latency being made small and the time up to the outputting of the data being matched to the address access time.

Thus, in the synchronous DRAM, the /CAS latency can be designated by the mode register.

Where the /CAS latency is made large so as to increase the burst transfer frequency, it is necessary to increase the multiplicity of the internal processing of the data. Therefore, in the second embodiment, the multiplicity was increased by using both the pipeline system and the prefetch system and, as a result, it was enabled to achieve a high burst transfer frequency under the condition of large /CAS latency.

However, in the second embodiment explained, since the prefetch system was adopted, it was not possible to cope with the /CAS latency that is less than the parallel degree of the data process in the system. Also, even in the case of the /CAS latency above the parallel degree, there was a problem that the input/output of data had to be carried out based on the unit of parallel degrees.

In the third embodiment, in order to overcome the above problem, the switching is made and controlled such that, when a large /CAS latency is used for realizing a high burst transfer frequency, both the pipeline system and the prefetch system are caused to be operated and, conversely when a small /CAS latency is used, only the pipeline system is caused to be operated.

In this third embodiment, under the large /CAS latency, the system operates in the same way as in the second embodiment shown in FIG. 10. Therefore, the structural arrangement of this third embodiment is the same as that shown in FIG. 8 used for explaining the second embodiment, and the circuit configuration of the FIFO buffer circuit is the same as that shown in FIG. 9.

Also, the operation under the large /CAS latency is the same as that in the second embodiment shown in FIG. 10. However, whereas, in the second embodiment, the prefetch operation is performed irrespective of the /CAS latency, no prefetch is performed under the small /CAS latency in this third embodiment.

Figure 12:
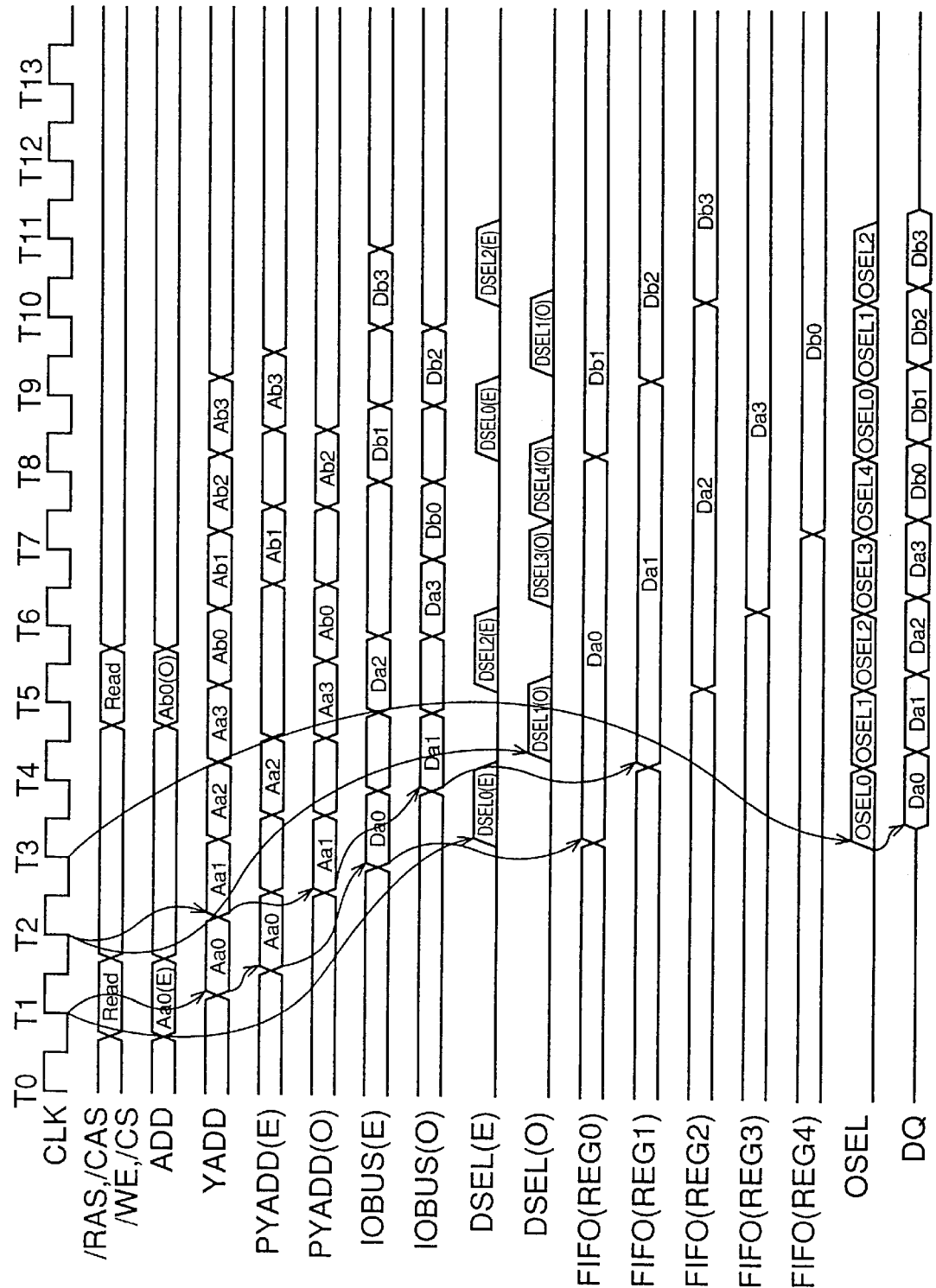
FIG. 12 is a timing chart also for use in explaining the operation of the device of the third embodiment according to the invention.

FIG. 12 is a timing chart for showing the operation of the small /CAS latency operated solely by the pipeline system. The /CAS latency is "3", and the remaining conditions are the same as those used for explaining the timing chart of FIG. 10.

In this third embodiment, because of the /CAS latency, respective blocks shown in the block diagram have operational differences as explained below.

(1) Under the large /CAS latency, the internal column address signal YADD is outputted every two clocks of the internal reference clock ICLK and, under the small /CAS latency, the same is outputted at each clock.

(2) Under the large /CAS latency, as shown in the second embodiment, two even number pre-decode column address signals PYADD are generated simultaneously from one internal column address signal YADD and, under the small /CAS latency, one pre-code column address signal PYADD is generated from one signal YADD. At this time, whether the even number pre-decode column address signal PYADD (E) is to be generated or the odd number pre-decode column address signal PYADD(O) is to be generated, depends on whether the internal column address signal YADD is the even number or odd number.

(3) Under the large /CAS latency, as shown in FIG. 12 for the second embodiment, two data read-out to both the IOBUS(E) and the IOBUS(O) every two cycles of the internal reference clock signal ICLK are taken into the FIFO buffer by simultaneously activating both the DSEL(E) and the DSEL(O) and, under the small /CAS latency, one data readout either to the IOBUS(E) or the IOBUS(O) at each cycle of ICLK is taken into the FIFO buffer by activating either the DSEL(E) or the DSEL(O). Which is to be activated depends on whether the internal column address signal YADD is the even number or odd number.

Now, the operation of the system under the small /CAS latency in this third embodiment is explained with reference to FIG. 12.

In FIG. 12, since the address Aa0 of the leading burst data is an even number when the read (Read) command is inputted at the time (cycle time) T1, the address Aa0 is outputted to the even number pre-decode column address signal PYADD(E) based on the clock edge of the internal reference clock signal ICLK at the time T1 and, since the address Aa1 of the second burst data is an odd number, the address Aa1 of the odd number pre-decode column address signal PYADD(O) is outputted based on the clock edge of the internal reference clock signal ICLK at the time T2.

Also, since the address Aa0 of the leading burst data is an odd number when the read (Read) command is inputted at the time (cycle time) T5, the address Ab0 is outputted to the odd number pre-decode column address signal PYADD(O) based on the clock edge of the internal reference clock signal ICLK at the time T5 and, since the address Ab1 of the second burst data is an even number, the address Ab1 of the even number pre-decode column address signal PYADD(E) is outputted based on the clock edge of the internal reference clock signal ICLK at the time T6.

In the above way, under the small /CAS latency, two bit data are read out to both the even number data input/output buses (IOBUS) 112-1 and 112-2 in parallel from the DRAM core every two clocks of the internal reference clock ICLK and, under the small /CAS latency, one bit each of the data is read out to either the even number data input/output bus (IOBUS) or the odd number input/output bus (IOBUS) from the DRAM core at each clock of the internal reference clock ICLK.

Under the small /CAS latency, with the same procedure as in the second embodiment, the data of both the even number and odd number buses (IOBUS) are taken into the FIFO buffer every two clocks of the reference clock in the output sequence by making reference to the internal column address signals YADD.

Under the small /CAS latency, the data of either the odd or even number bus (IOBUS) is taken into the FIFO buffer at each clock of the internal reference clock ICLK by making reference to the internal column address signal YADD.

In FIG. 12, since the address Aa0 of the leading burst data is an even number when the read command is inputted at the time T1, the DSEL0(E) is activated thereby for taking into the FIFO buffer the data Da0 outputted to IOBUS(E).

Also, since the address Aa1 of the second burst data is an odd number, the DSEL1(O) is activated thereby for taking into the FIFO buffer the data Da1 outputted to IOBUS(O). The address Ab0 of the first burst data is an odd number when the read command is inputted at the time T5, the DSEL4(O) is activated thereby for taking into the FIFO buffer the data Db0 outputted to IOBUS(O). Also, since the address Aa1 of the second burst data is an even number, the DSEL0(E) is activated thereby for taking into the FIFO buffer the data Db1 outputted to IOBUS(E).

With the procedure explained above, the data are stored in the output sequence in the FIFO buffer irrespective of the presence or non-presence of the prefetch operation based on the /CAS latency. Thus, the OSEL can be controlled exactly in the same way as in the second embodiment.

As above, under the large /CAS latency, a high speed burst transfer frequency is realized by combining the pipeline system and the prefetch system and allowing the small /CAS latency to operate solely by the pipeline system.

Figure 13:
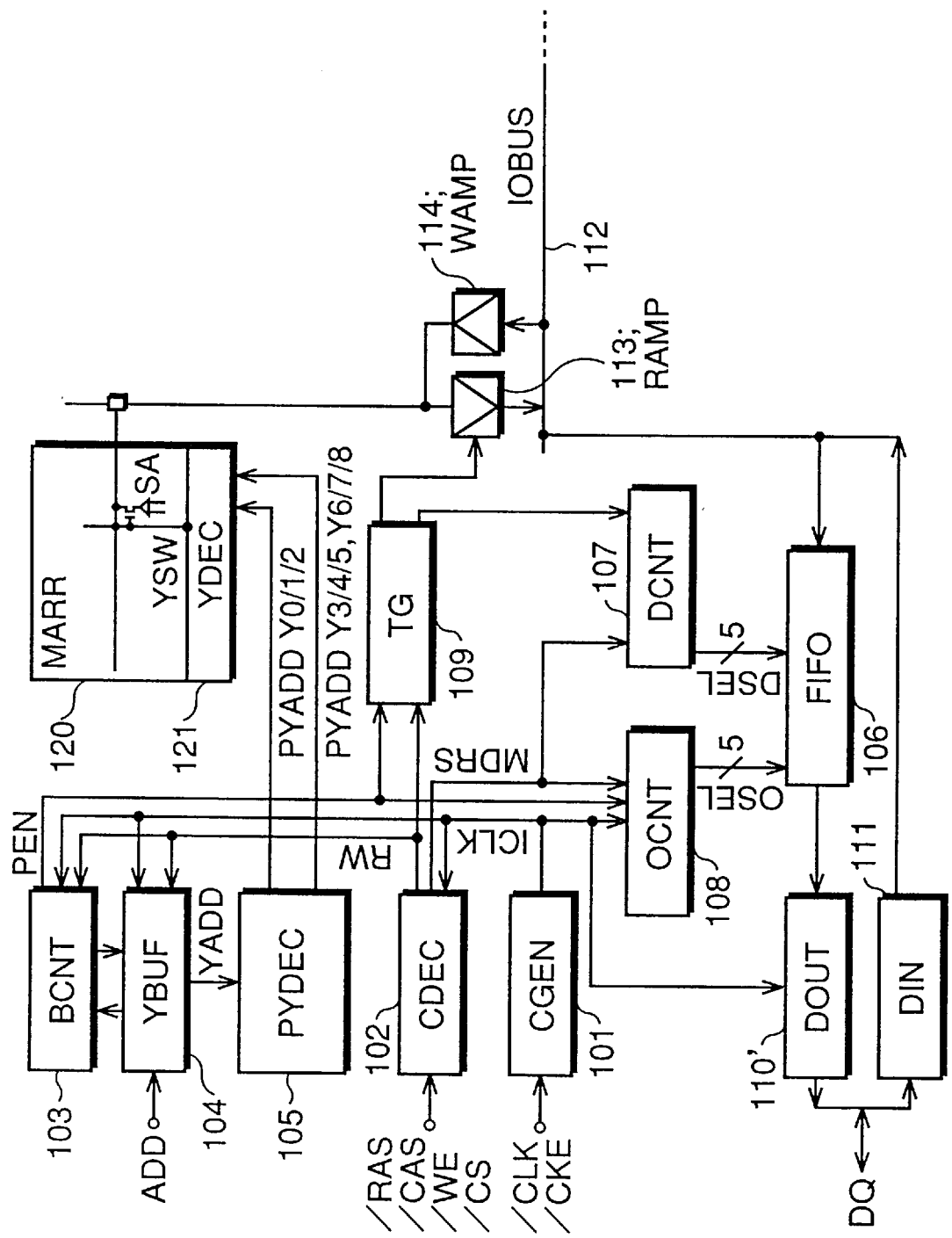
FIG. 13 is a block diagram for showing a structure of a device of a fourth embodiment according to the invention.
Figure 14:
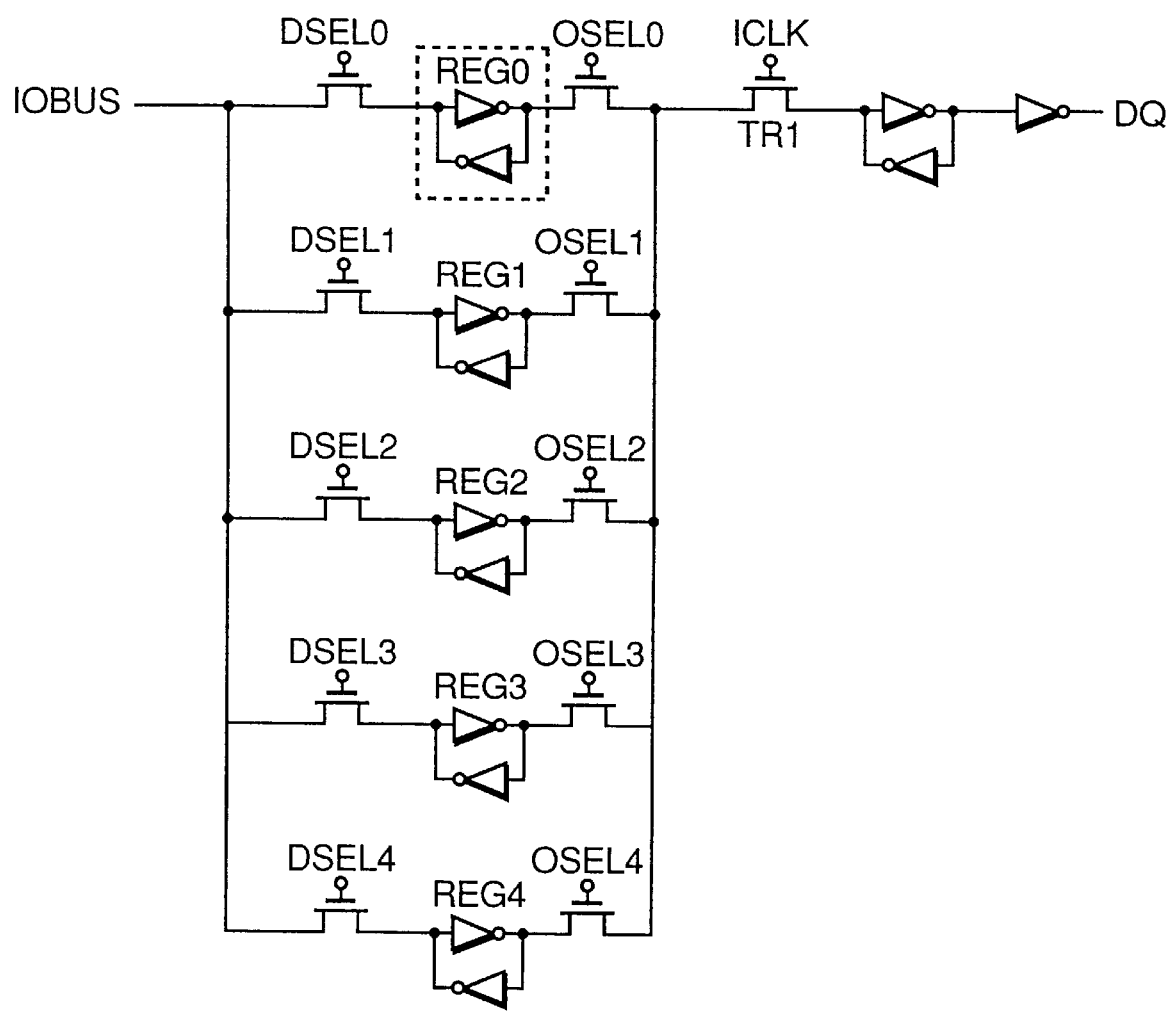
FIG. 14 is a circuit diagram for showing a structure of an FIFO buffer and a data output buffer used in the device of the fourth embodiment according to the invention.

FIG. 13 is a block diagram for showing the structure of a fourth embodiment according to the invention. FIG. 14 shows a part of the first-in first-out (FIFO) buffer and data output buffer included in the block diagram of the fourth embodiment shown in FIG. 13. FIG. 14 is a timing chart for use in explaining the operation of the circuit of the fourth embodiment according to the invention.

In the first to third embodiments, the output of the data output buffer (DOUT) 110 is controlled by the OSEL. In this way, the insertion of control circuits in the data path can be minimized, and the advantage therein is that the address access time is short.

However, there is a shortcoming in that, since the control of the OSEL begins after the clock edge for the data output is provided from the outside, the clock access time (the time from the provision of the reference clock from the outside for the output to the time when the data is outputted) is prolonged.

Thus, in this fourth embodiment, one stage of latch circuit is provided after the FIFO buffer 106. The time when the data outputted to the outside of the chip actually changes is when the latch circuit starts its latching operation. This latch circuit is only for simply latching the data in accordance with the reference clock so that the clock access time is short.

The arrangements in this fourth embodiment are explained with reference to FIG. 13. As can be seen from FIG. 13, the difference in the arrangements as compared with those in the first embodiment shown in FIG. 3 is in the point where the internal reference clock signal ICLK is inputted to the data output buffer (DOUT) 110'. The remaining arrangements are the same as those in the first embodiment.

In FIG. 14, the data path of the FIFO buffer 106 and the data-out buffer (DOUT) 110' is shown, and the arrangements the same as those in the first embodiment shown in FIG. 4 except for the latch circuit which is disposed after a transistor TR1 for being controlled by the internal reference clock ICLK.

Figure 15:
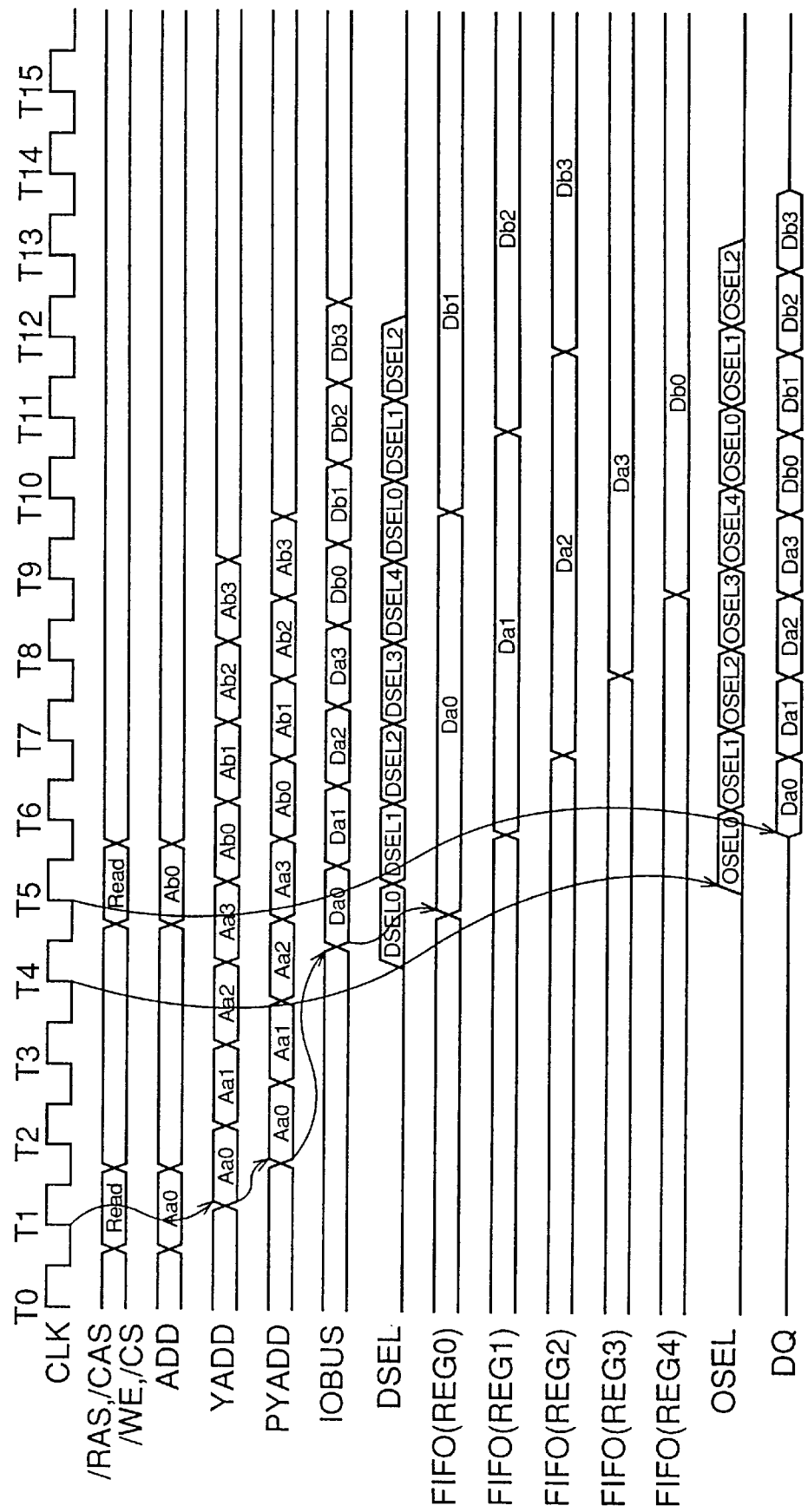
FIG. 15 is a timing chart for use in explaining the operation of the device of the fourth embodiment according to the invention.

Details of this fourth embodiment are hereinafter explained with reference to the timing chart of FIG. 15. Whereas, in the first embodiment explained, the OSEL0 which outputs from the FIFO buffer 106 the leading burst data Da0 by the read (Read) command inputted at the time T1, is activated at the clock edge of the internal reference clock signal ICLK at the time T5 after a (/CAS latency–1) cycle from the inputting of the command, the OSEL0 is activated at the clock edge of the internal reference clock signal ICLK at the time T4 after a (/CAS latency–2).

In the first embodiment, the data is outputted to the outside of the chip immediately after the activation but, in the fourth embodiment, the pass transistor TR1 is first activated (that is, the transistor TR1 is in a conductive state) at the clock edge of the internal reference clock signal ICLK at the next time T5 and only then the data is outputted.

In this fourth embodiment, the arrangements may well take the form of a combination of the second embodiment and the third embodiment.

Figure 16:
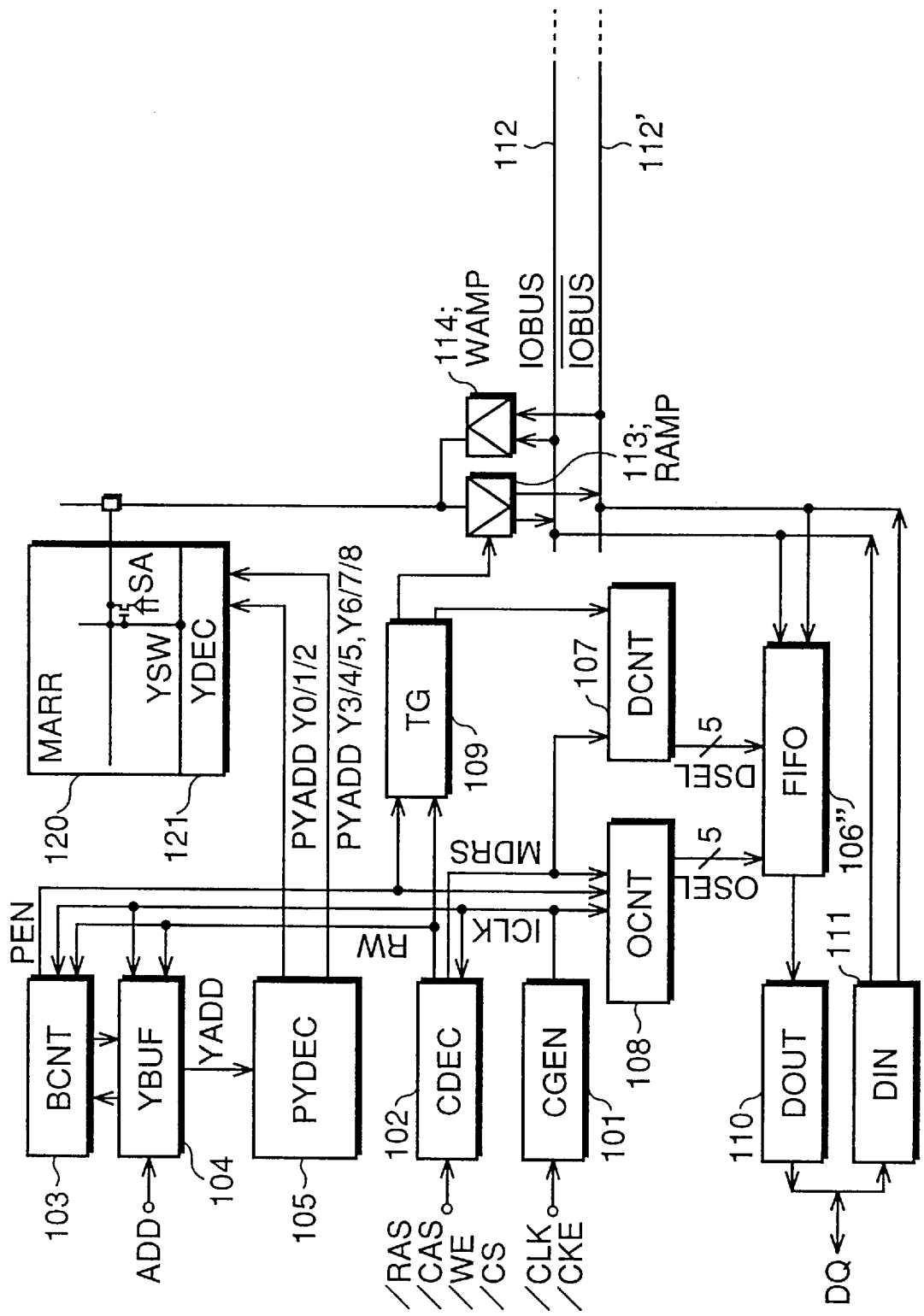
FIG. 16 is a block diagram for showing a structure of a device of a fifth embodiment according to the invention.
Figure 17:
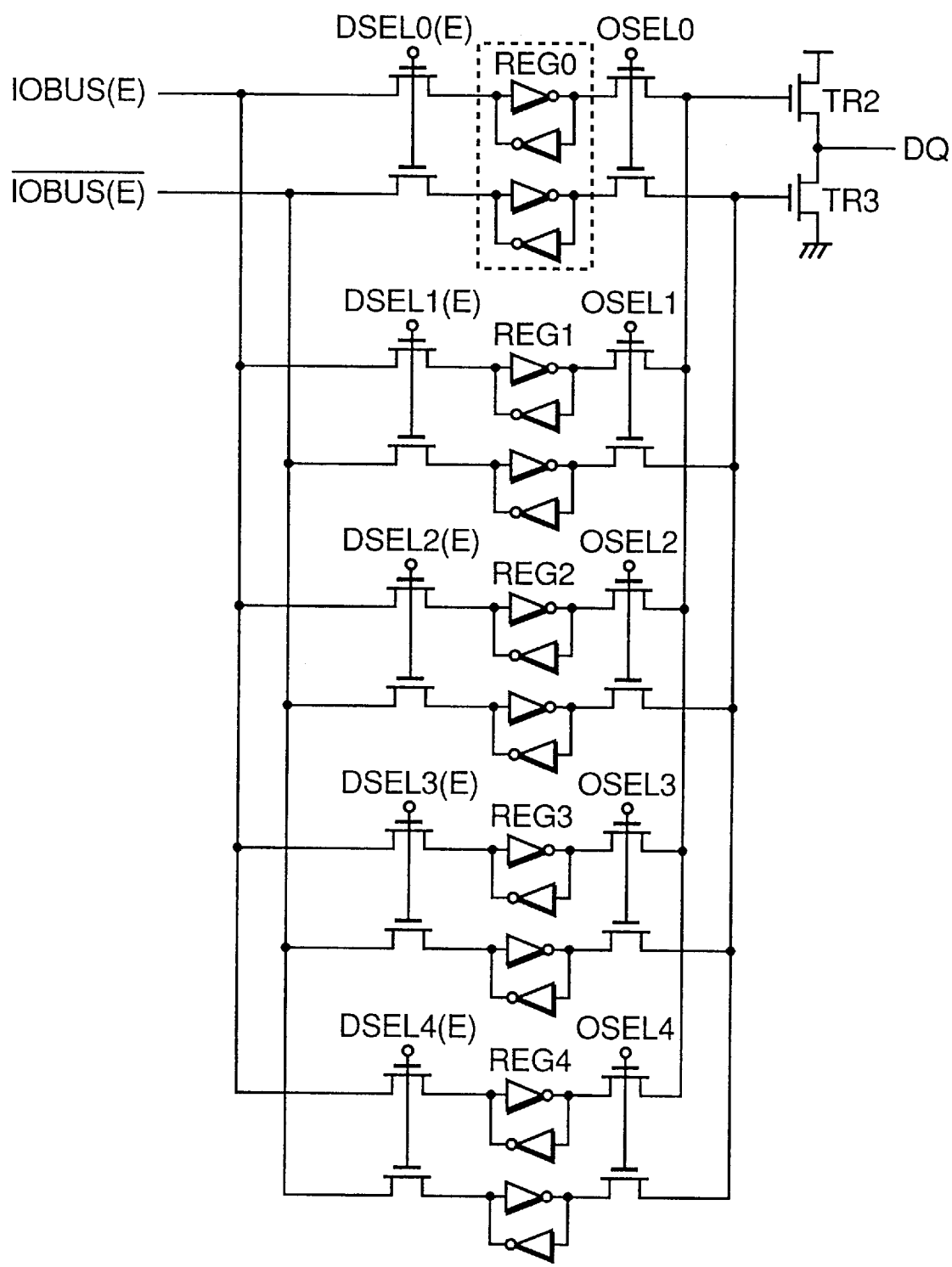
FIG. 17 is a circuit diagram for showing a structure of an FIFO buffer and a data output buffer used in the device of the fifth embodiment according to the invention.
Figure 18:
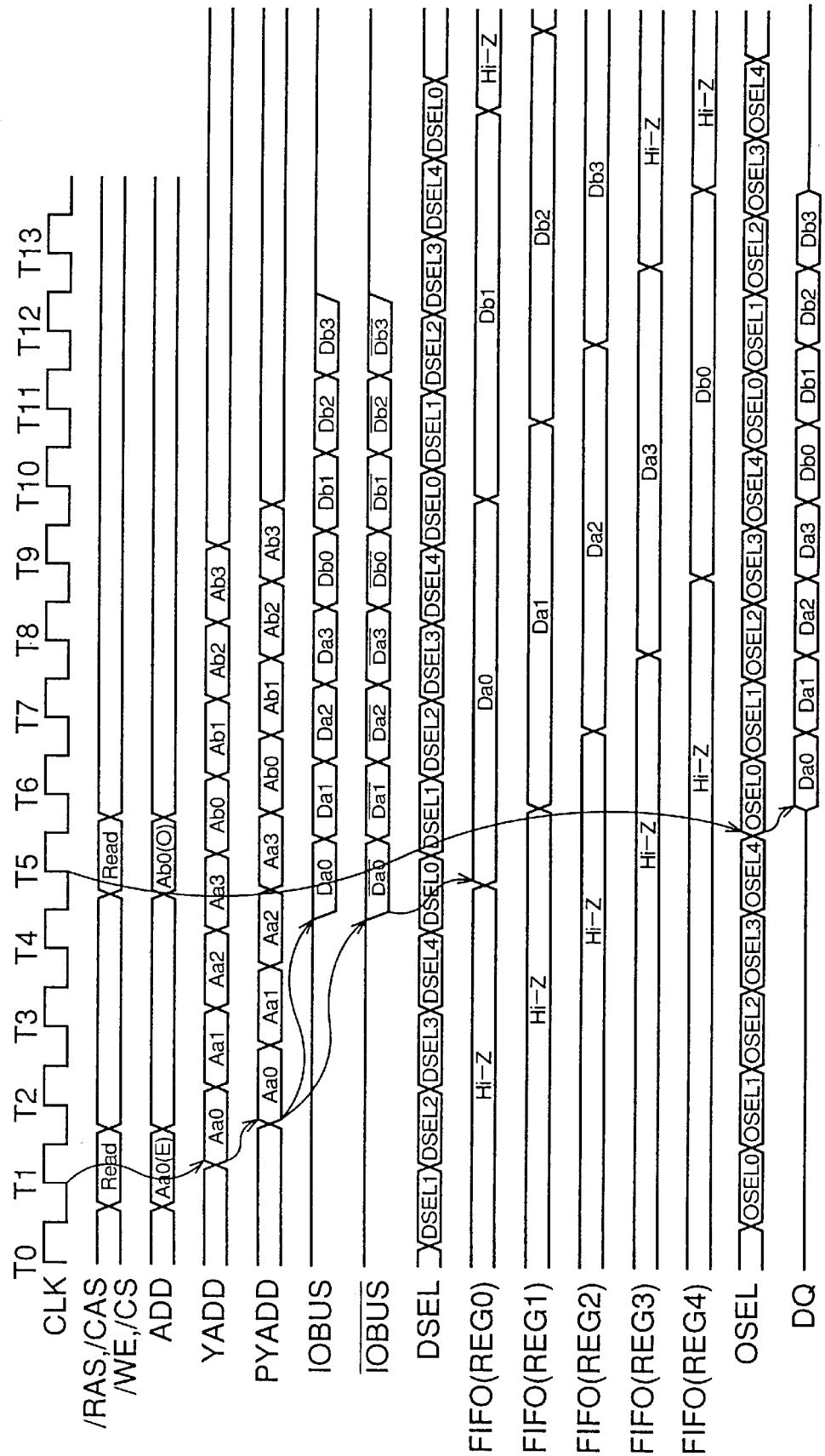
FIG. 18 is a timing chart for use in explaining the operation of the device of the fifth embodiment according to the invention.

FIG. 16 is a block diagram for showing the structure of a fifth embodiment according to the invention. FIG. 17 shows a part of the first-in-first out (FIFO) buffer and data output buffer DOUT included in the block diagram of the fifth embodiment shown in FIG. 16. FIG. 18 is a timing chart for use in explaining the operation of the circuit of the fifth embodiment according to the invention.

The fifth embodiment is explained with reference to the drawings.

In this embodiment, the data input/output buses (IOBUS) are complementary signal buses. During the period in which the data are not being read from the memory cell array (MARR) 120, the complementary signal buses (/IOBUS) are precharged to the same potential (high potential) both by the read amplifier (RAMP) 113 and the write amplifier (WAMP) 114.

With the same procedure as used in the first embodiment, when the data Da0, etc. are read-out from the memory cell array (MARR) 120 at each edge of the internal reference clock ICLK during the read (Read) command burst period, only either IOBUS or /IOBUS is caused to undergo a potential change (from high to low) by the value of the data Da0.

Conversely when the read data corresponding to the edge of the reference clock is not present, both the IOBUS and the /IOBUS maintain the precharged potential (high potential).

That is, the data input/output buses (IOBUS) 112 and 1121 which are complementary signal buses in this fifth embodiment have, in addition to the logic "0" or "1", a state of no output data (Hi-Z output, i.e., high impedance output) from the memory cell array (MARR) 120, hence three values. The FIFO buffer 106" stores three values.

Thus, as shown in FIG. 17, the FIFO buffer 106" is constituted by two flip-flops in which each of the registers REG0–REG4 takes-in the value of the data input/output buses IOBUS and the /IOBUS.

When the data are latched by the two flip-flops, one of the complementary signals outputted through the transfer transistor which is rendered to be conductive by the OSEL signal turns to a high potential so that, with one of the transistor TR2 and the transistor TR3 which input complementary signals to the gate electrode becoming activated and becoming conductive, a high potential or a low potential is outputted to the outside of the chip.

When the data are not latched (both the IOBUS and the /IOBUS latch a high potential state and latch a Hi-Z output), both the transistors TR2 and TR3 turn to a non-active state, that is, the state in which the data is not outputted.

In this fifth embodiment, whether to output the data or not (whether to output "0" or "1", or Hi-Z) is determined only by whether the data is outputted by the memory cell array (MARR) 120 or the data is not outputted at all. As to the DSEL signal and the OSEL signal, either may well have been activated.

Thus, there is no need to determine the presence or non-presence of the data output after the edge designating the outputting of the external reference clock is inputted so that the clock access time becomes short.

In this fifth embodiment, the arrangements may well take the form of a combination of the second embodiment with the third embodiment or with the fourth embodiment.

Figure 19:
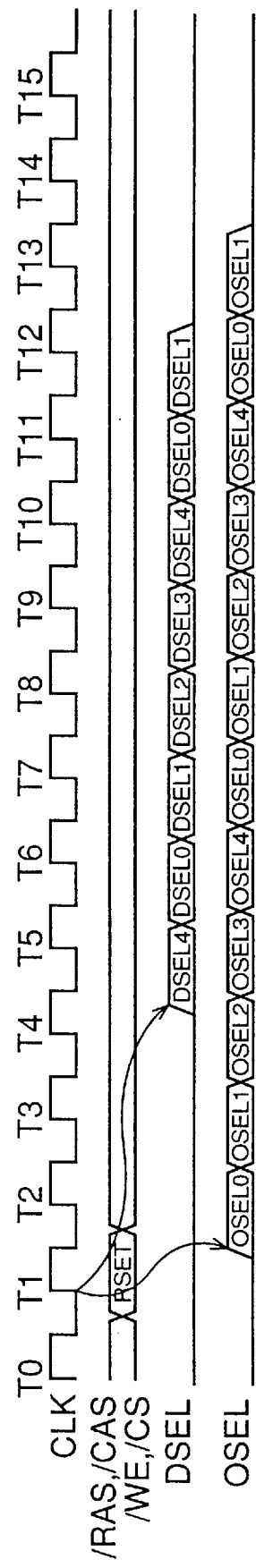
FIG. 19 is a timing chart for use in explaining the operation of the device of the sixth embodiment according to the invention.

FIG. 19 is a timing chart for use in explaining the operation of a sixth embodiment according to the invention.

As has been made clear, in the first to fifth embodiments, the initialization of the FIFO buffer input control counter (DCNT) is effected at the edge of the reference clock that takes-in the mode register set command, and the initialization of the FIFO buffer output control counter (OCNT) is effected at the edge after the number of reference clocks designated based on the /CAS latency number from the edge of the reference clock that takes-in the mode register set command. By making these initializations the same as each other, the control of the data output by the read command can be carried out appropriately. For this reason, it is necessary to provide the counter circuit which designates the edge of the reference clock that effects the initialization of the OCNT by the /CAS latency.

In FIG. 7, since the /CAS latency is "4", the initialization of the OCNT is effected based on the time T5 after a (/CAS latency−1) cycle from the clock edge at the time T1 for taking-in the mode register set command. Therefore, it is necessary to provide the counter circuit which counts the number of cycles up to T1–T5.

In this sixth embodiment, in order to simplify the control circuit, it is so arranged that, as shown in FIG. 18, the DCNT is initialized by the initial value that renders both the DCNT and the OCNT to become equivalent to the above indicated initialization by the edge of the reference clock that takes-in the mode register set command. The initial value of the DCNT varies depending on the /CAS latency. The /CAS latency is adjusted by the initial values of the DCNT because the /CAS latency can be determined internally between the delays.

Where the circuit is configured as above, it is not necessary to provide a special counter circuit for the purpose of initializing the OCNT value.

In this sixth embodiment, although the DSEL and OSEL signals are outputted over the entire cycles to the extent explained, it is sufficient in practice if the activation is effected only when the data is inputted/outputted to the FIFO buffer. Also, although the initialization of the FIFO buffer control is effected by the inputting of the mode register set command, this may well be effected by the operations which occur in any case before the read command is inputted, such as the switching-on operation and the inputting of the activation command.

As has been explained above, according to the invention, it is possible to provide a semiconductor memory device having a high burst mode, in which there is almost no additional gate delay, without any substantial increase in its area.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor memory device having a burst transfer function, comprising:

a circuit system which generates an internal column address from an address signal based on a reference clock signal and reads-out to an input/output bus a data through a sense amplifier and a read-out amplifier from a memory cell in which a pre-decoded column address connected to a selection line of a memory cell array through a decoder, said circuit system being configured at least by one of a pipeline system and a prefetch system, said pipeline system being one in which a plurality of process operations are carried out in one and the same cycle and said prefetch system being one in which a plurality of signal paths are provided in parallel; and a first-in first-out buffer circuit which is provided between said input/output bus and an output buffer circuit, and which is configured such that said data from said memory cell is processed in asynchronization with said reference clock until said data arrives at said first-in first-out buffer circuit.

2. A semiconductor memory device having a burst transfer function, comprising:

a circuit system which generates an internal column address from an address signal based on a reference clock signal and reads-out to an input/output bus a data through a sense amplifier and a read-out amplifier from a memory cell in which a pre-decoded column address connected to a selection line of a memory cell array through a decoder, said circuit system being configured at least by one of a pipeline system and a prefetch system, said pipeline system being one in which a plurality of process operations are carried out in one and the same cycle and said prefetch system being one in which a plurality of signal paths are provided in parallel; and a first-in first-out buffer circuit which is provided between said circuit system and an output buffer circuit, and which is configured such that an input to said first-in first-out buffer circuit is controlled by an input control signal generated by a first counter correspondingly with an internal data input/output timing, and an output from said first-in first-out buffer circuit is controlled by an output control signal generated by a second counter correspondingly with a clock based on a /CAS latency.

3. A semiconductor memory device according to claim 1, in which said first-in first-out buffer circuit is configured such that, when said /CAS latency is large, both said pipeline system and said prefetch system are used, and the data on both even number and odd number input/output buses are taken into said first-in first-out buffer circuit every two clocks of said reference clock in sequence in which such data are outputted with reference being made to said internal column address signal and, when said /CAS latency is small, the data on either the even number input/output bus or the odd number input/output bus is taken into said first-in first-out buffer circuit every clock of said reference clock with reference being made to said internal column address signal.

4. A semiconductor memory device according to claim 2, in which said first-in first-out buffer circuit is configured such that, when said /CAS latency is large, both said pipeline system and said prefetch system are used, and the data on both even number and odd number input/output buses are taken into said first-in first-out buffer circuit every two clocks of said reference clock in sequence in which such data are outputted with reference being made to said internal column address signal and, when said /CAS latency is small, the data on either the even number input/output bus or the odd number input/output bus is taken into said first-in first-out buffer circuit every clock of said reference clock with reference being made to said internal column address signal.

5. A semiconductor memory device according to claim 1, in which said input/output bus is constituted by input/output buses for transmitting complementary signals, and said first-in first-out buffer circuit is configured so as to hold and output an Hi-Z state in addition to logical "1" or "0".

6. A semiconductor memory device according to claim 2, in which said input/output bus is constituted by input/output buses for transmitting complementary signals, and said first-in first-out buffer circuit is configured so as to hold and output an Hi-Z state in addition to logical "1" or "0".

7. A semiconductor memory device according to claim 3, in which said input/output bus is constituted by input/output buses for transmitting complementary signals, and said first-in first-out buffer circuit is configured so as to hold and output an Hi-Z state in addition to logical "1" or "0".

8. A semiconductor memory device according to claim 4, in which said input/output bus is constituted by input/output buses for transmitting complementary signals, and said first-in first-out buffer circuit is configured so as to hold and output an Hi-Z state in addition to logical "1" or "0".

* * * * *